United States Patent
Miyoshi

(10) Patent No.: US 8,570,036 B2
(45) Date of Patent: Oct. 29, 2013

(54) MAGNETIC RESONANCE IMAGING APPARATUS AND METHOD UTILIZING RF PULSE FLIP ANGELS

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 522 days.

(21) Appl. No.: 12/826,055

(22) Filed: Jun. 29, 2010

(65) Prior Publication Data

US 2010/0327871 A1    Dec. 30, 2010

(30) Foreign Application Priority Data

Jun. 30, 2009  (JP) ................. 2009-155540
Apr. 28, 2010  (JP) ................. 2010-103442

(51) Int. Cl.
*G01R 33/48*    (2006.01)

(52) U.S. Cl.
USPC ........................... 324/309; 324/307

(58) Field of Classification Search
USPC ............... 324/307, 309; 600/413, 419
See application file for complete search history.

(56) References Cited

U.S. PATENT DOCUMENTS

| | | | |
|---|---|---|---|
| 4,795,978 A | | 1/1989 | Zur et al. |
| 5,270,654 A | * | 12/1993 | Feinberg et al. ............ 324/309 |
| 5,285,158 A | | 2/1994 | Mistretta et al. |
| 5,402,787 A | * | 4/1995 | Van Yperen ................. 600/410 |
| 5,548,216 A | | 8/1996 | Dumoulin et al. |
| 5,860,921 A | | 1/1999 | Ma et al. |
| 6,064,203 A | * | 5/2000 | Bottomley .................... 324/307 |
| 6,078,176 A | | 6/2000 | McKinnon |
| 6,456,071 B1 | * | 9/2002 | Hennig ......................... 324/307 |
| 6,486,668 B1 | | 11/2002 | Ma |
| 6,528,997 B2 | * | 3/2003 | Zhong et al. ................. 324/307 |
| 6,587,708 B2 | | 7/2003 | Venkatesan et al. |
| 7,064,545 B2 | * | 6/2006 | Zaharchuk et al. .......... 324/307 |
| 7,541,809 B2 | | 6/2009 | Miyoshi |
| 2006/0020198 A1 | | 1/2006 | Riederer et al. |
| 2006/0080044 A1 | | 4/2006 | Ropele |
| 2007/0167733 A1 | | 7/2007 | Miyoshi |
| 2008/0150530 A1 | * | 6/2008 | Miyoshi ....................... 324/309 |

FOREIGN PATENT DOCUMENTS

JP    2000-005144    1/2000
JP    2007-190362    8/2007

* cited by examiner

*Primary Examiner* — Melissa Koval
*Assistant Examiner* — Rishi Patel
(74) *Attorney, Agent, or Firm* — Armstrong Teasdale LLP

(57) ABSTRACT

A magnetic resonance imaging (MRI) apparatus sequentially transmits a plurality of radio frequency (RF) pulses having flip angles of $\alpha 1°$, $\alpha 2°$, $-\alpha 1°$, and $-\alpha 2°$ for refocusing transverse magnetization of spins, and brings the transverse magnetization of the spins to longitudinal magnetization after the refocusing of the transverse magnetization of the spins.

14 Claims, 15 Drawing Sheets

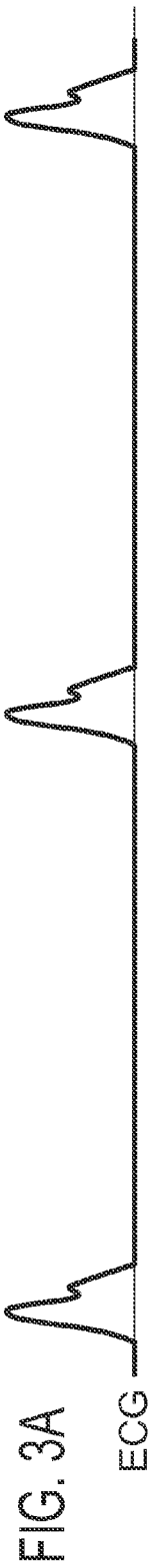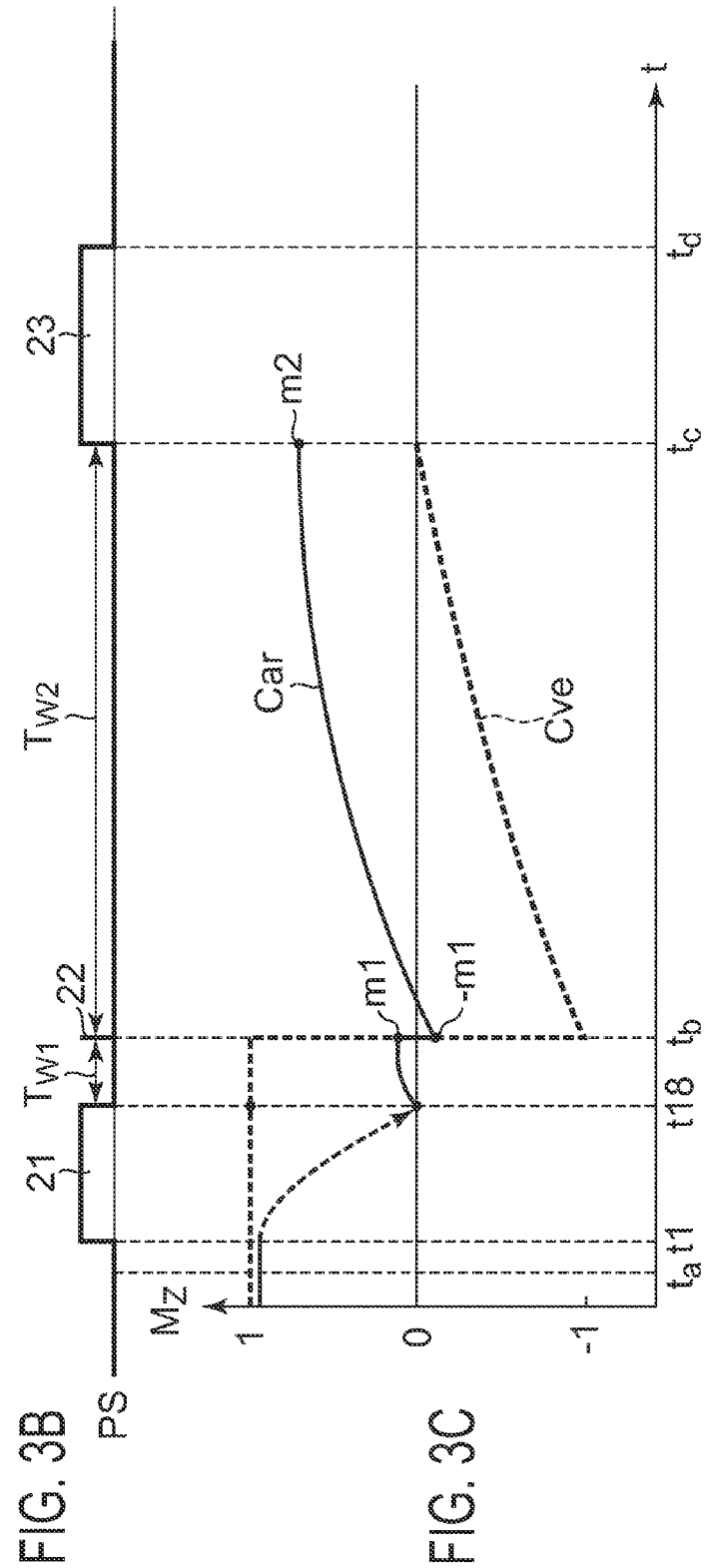

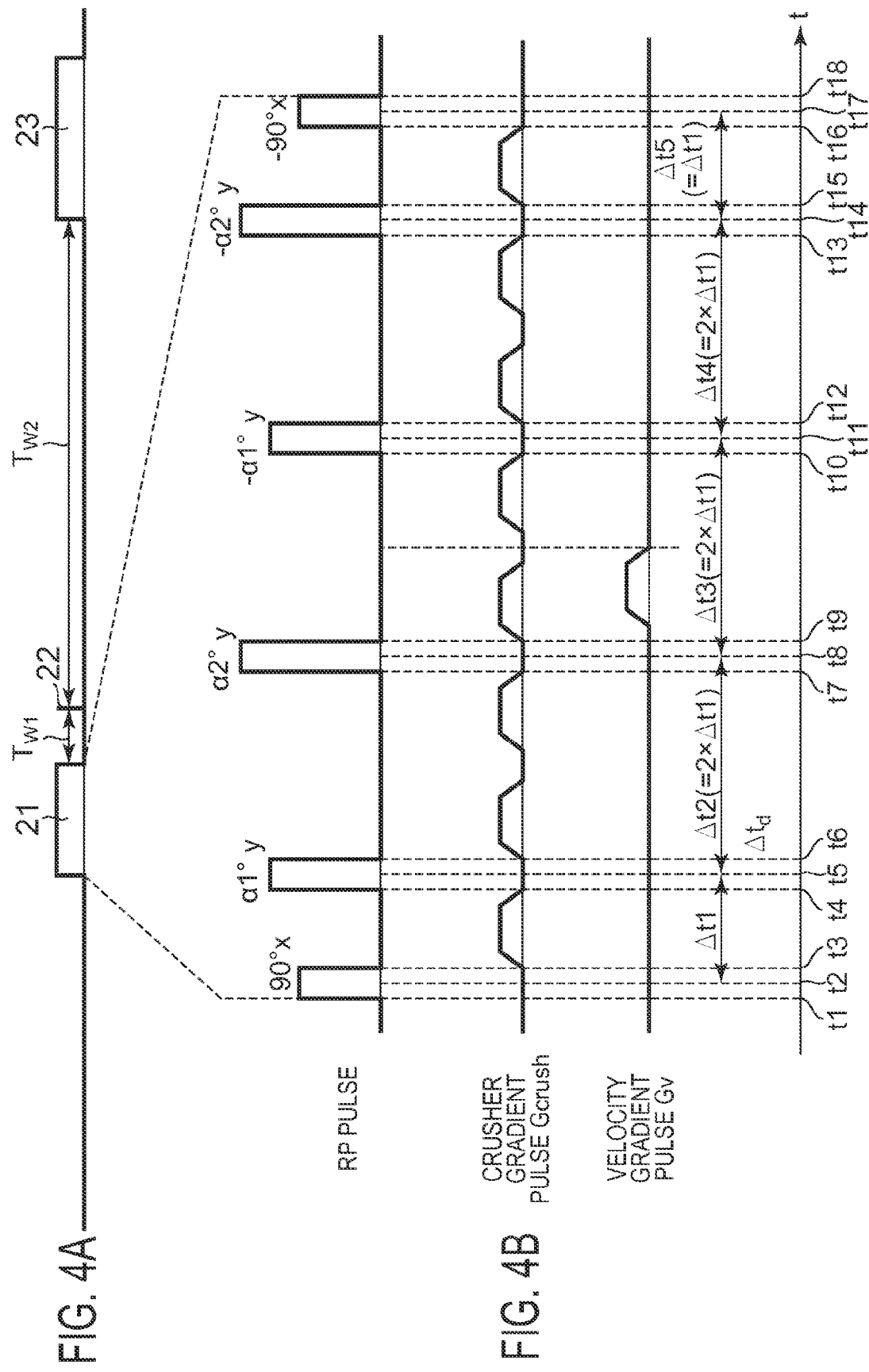

FIG. 5

| | RF PULSE | | | | | |
|---|---|---|---|---|---|---|
| | 90° x | α1° y | α2° y | -α1° y | -α2° y | -90° x |
| FLIP ANGLE OF RF PULSE | 90° | α1°=180°−Δd1° (0°<d1°<180°) | α2°=180+Δd2° (0°<d2°<180°) | -α1°=(180°−Δd1°) (0°<d1°<180°) | -α2°=(180°+Δd2°) (0°<d2°<180°) | -90° |
| PHASE OF RF PULSE | x | y | y | y | y | x |
| TRANSMISSION TIME OF RF PULSE | t1~t3 | t4~t6 | t7~t9 | t10~t12 | t13~t15 | t16~t18 |
| CENTRAL TIME OF RF PULSE | t2 | t5 | t8 | t11 | t14 | t17 |

MAGNETIC RESONANCE IMAGING APPARATUS AND METHOD UTILIZING RF PULSE FLIP ANGLES

CROSS REFERENCE TO RELATED APPLICATIONS

This application claims the benefit of Japanese Patent Application No. 2009-155540 filed Jun. 30, 2009 and Japanese Patent Application No. 2010-103442 filed Apr. 28, 2010, both of which are hereby incorporated by reference in its entirety.

BACKGROUND OF THE INVENTION

The present invention relates to a magnetic resonance imaging apparatus that transmits RF pulses for refocusing transverse magnetization of spins.

In a magnetic resonance imaging apparatus, unevenness in signal intensity appears in an image due to ununiformity in static magnetic field (B0 ununiformity) and hence the quality of the image may be deteriorated. There has therefore been proposed a method for reducing image deterioration due to ununiformity in static magnetic field (refer to Japanese Unexamined Patent Publication No. 2007-190362).

Japanese Unexamined Patent Publication No. 2007-190362 discloses a method of sequentially transmitting four RF pulses having flip angles of 180°, 180°, −180° and −180° between two RF pulses each having a flip angle of 45° to thereby reduce image deterioration due to ununiformity in static magnetic field. However, the method of the patent document 1 also has the problem of occurrence of unevenness in signal intensity due to ununiformity in RF transmission magnetic field (B1 ununiformity).

It is desirable that the problem described previously is solved.

BRIEF DESCRIPTION OF THE INVENTION

A first aspect of the invention is a magnetic resonance imaging apparatus which sequentially transmits RF pulses $\alpha1°_{\theta1°}$, $\alpha2°_{\theta2°}$, $-\alpha1°_{\theta1°}$ and $-\alpha2°_{\theta2°}$ (where $\alpha1°$, $\alpha2°$, $-\alpha1°$ and $-\alpha2°$: flip angles of the RF pulses, and $\theta1°$ and $\theta2°$: the phases of the RF pulses) for refocusing transverse magnetization of spins and brings the transverse magnetization of the spins to longitudinal magnetization after the refocusing of the transverse magnetization of the spins, wherein a combination of the flip angles $\alpha1°$, $\alpha2°$, $-\alpha1°$ and $-\alpha2°$ of the RF pulses $\alpha1°_{\theta1°}$, $\alpha2°_{\theta2°}$, $-\alpha1°_{\theta1°}$ and $-\alpha2°_{\theta2°}$ corresponds to any of the following combinations:

$(\alpha1°, \alpha2°, -\alpha1°, -\alpha2°)=(180°-\Delta d1°, 180°+\Delta d2°, -(180°-\Delta d1°), -(180°+\Delta d2°))$;

$(\alpha1°, \alpha2°, -\alpha1°, -\alpha2°)=(180°+\Delta d1°, -(180°-\Delta d2°), -(180°+\Delta d1°), 180°-\Delta d2°)$;

$(\alpha1°, \alpha2°, -\alpha1°, -\alpha2°)=(-(180°-\Delta d1°), -(180°+\Delta d2°), 180°-\Delta d1°, 180°+\Delta d2°)$;

$(\alpha1°, \alpha2°, -\alpha1°, -\alpha2°)=(-(180°+\Delta d1°), 180°-\Delta d2°, 180°+\Delta d1°, -(180°-\Delta d2°))$;

$(\alpha1°, \alpha2°, -\alpha1°, -\alpha2°)=(180°+\Delta d1°, 180°-\Delta d2°, -(180°+\Delta d1°), -(180°-\Delta d2°))$;

$(\alpha1°, \alpha2°, -\alpha1°, -\alpha2°)=(180°-\Delta d1°, -(180°+\Delta d2°), -(180°-\Delta d1°), 180°+\Delta d2°)$;

$(\alpha1°, \alpha2°, -\alpha1°, -\alpha2°)=(-(180°+\Delta d1°), -(180°-\Delta d2°), 180°+\Delta d1°, 180°-\Delta d2°)$; and and $(\alpha1°, \alpha2°, -\alpha1°, -\alpha2°)=(-(180°-\Delta d1°), 180°+\Delta d2°, 180°-\Delta d1°, -(180°+\Delta d2°))$, where $0°<\Delta d1°$ and $\Delta d2°<180°$.

A second aspect of the invention is a magnetic resonance imaging apparatus which sequentially transmits RF pulses $\alpha1°_{\theta1°}$, $\alpha2°_{\theta2°}$, $\alpha1°_{\theta1°}$ and $\alpha2°_{\theta2°}$ (where $\alpha1°$ and $\alpha2°$: flip angles of the RF pulses, and $\theta1°$ and $\theta2°$: the phases of the RF pulses) for refocusing transverse magnetization of spins and brings the transverse magnetization of the spins to longitudinal magnetization after the refocusing of the transverse magnetization of the spins, wherein a combination of the flip angles $\alpha1°$ and $\alpha2°$ corresponds to any of the following combinations:

$(\alpha1°, \alpha2°)=(180°-\Delta d1°, 180°+\Delta d2°)$;

$(\alpha1°, \alpha2°)=(180°+\Delta d1°, -(180°-\Delta d2°))$;

$(\alpha1°, \alpha2°)=(-(180°-\Delta d1°), -(180°+\Delta d2°))$;

$(\alpha1°, \alpha2°)=(-(180°+\Delta d1°), 180°-\Delta d2°)$;

$(\alpha1°, \alpha2°)=(180°+\Delta d1°, 180°-\Delta d2°)$;

$(\alpha1°, \alpha2°)=(180°-\Delta d1°, -(180°+\Delta d2°))$;

$(\alpha1°, \alpha2°)=(-(180°+\Delta d1°), -(180°-\Delta d2°))$; and $(\alpha1°, \alpha2°)=(-(180°-\Delta d1°), 180°+\Delta d2°)$, where $0°<\Delta d1°$ and $\Delta d2°<180°$.

In the invention, RF pulses whose flip angles are shifted by $\Delta d1$ or $\Delta d2$ from $180°$ (or $-180°$) are used. Using such RF pulses makes it possible to reduce unevenness in signal intensity due to B1 ununiformity.

Further objects and advantages of the present invention will be apparent from the following description of the preferred embodiments of the invention as illustrated in the accompanying drawings.

BRIEF DESCRIPTION OF THE DRAWINGS

FIGS. 3A, 3B, and 3C are explanatory diagrams of a pulse sequence for imaging arterial blood AR.

FIGS. 4A and 4B are diagrams for describing a concrete configuration of a longitudinal magnetization adjusting sequence 21.

FIG. 5 is a diagram for explaining RF pulses 90° x, $\alpha1°$ y, $\alpha2°$ y, $-\alpha1°$ y, $\alpha2°$ y and −90° x.

DETAILED DESCRIPTION OF THE INVENTION

While modes for carrying out the invention will be explained below, the invention will not be limited to the following modes.

(1) First Embodiment

Figure 1:
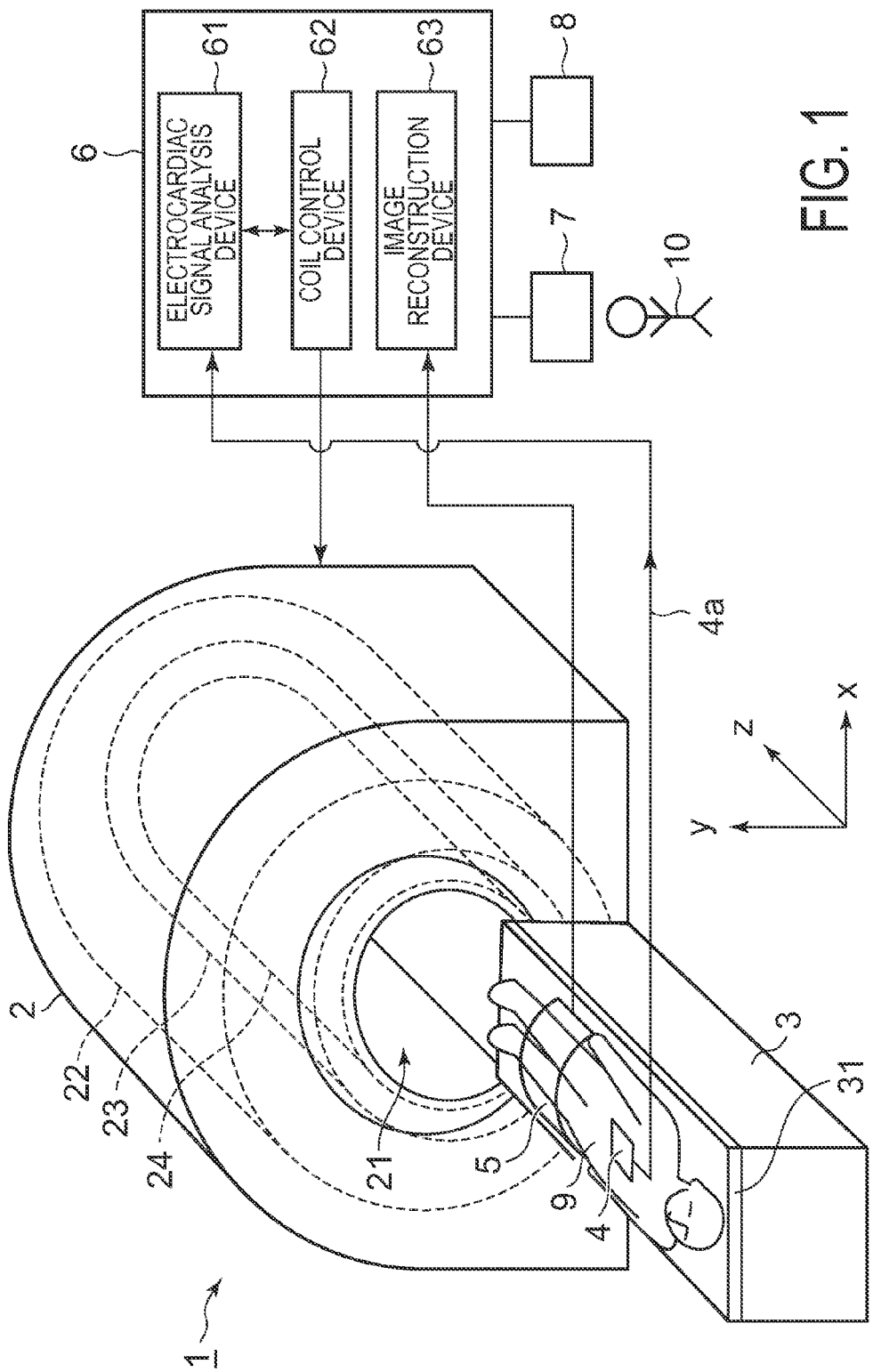
FIG. 1 is a block diagram of a magnetic resonance imaging apparatus 1 according to a first embodiment of the invention.

FIG. 1 is a block diagram of a magnetic resonance imaging apparatus (hereinafter called "MRI apparatus", where MRI: Magnetic Resonance Imaging) 1 according to a first embodiment of the invention.

The MRI apparatus 1 has a coil assembly 2, a table 3, a heartbeat sensor 4, a receiving coil 5, a controller 6, an input device 7 and a display device 8.

The coil assembly 2 has a bore 21 into which a subject 9 is carried. The coil assembly 2 has a superconductive coil 22, a gradient coil 23 and a transmitting coil 24. The superconductive coil 22 applies a static magnetic field B0 to within the bore 21. The gradient coil 23 applies a gradient pulse to within the bore 21. The transmitting coil 24 transmits an RF pulse to within the bore 21.

The table 3 has a cradle 31. The cradle 31 is configured so as to move in a z direction and a −z direction. With the movement of the cradle 31 in the z direction, the subject 9 is conveyed to the bore 21. With the movement of the cradle 31 in the −z direction, the subject 9 conveyed to the bore 21 is carried out of the bore 21.

The heartbeat sensor 4 detects the heartbeat of the subject 9 and generates an electrocardiac signal 4a.

The receiving coil 5 receives each magnetic resonance signal therein.

The controller 6 has an electrocardiac signal analysis device 61, a coil control device 62 and an image reconstruction device 63.

The electrocardiac signal analysis device 61 analyzes the electrocardiac signal 4a.

The coil control device 62 controls the gradient coil 23 and the transmitting coil 24 in such a manner that a pulse sequence PS (refer to FIG. 3 to be described later) is executed, based on the result of analysis by the electrocardiac signal analysis device 61.

The image reconstruction device 63 reconstructs an image, based on the magnetic resonance signal received by the receiving coil 5.

The input device 7 inputs various instructions to the controller 6 in response to operations of an operator 10.

The display device 8 displays various information and images thereon.

Figure 2:
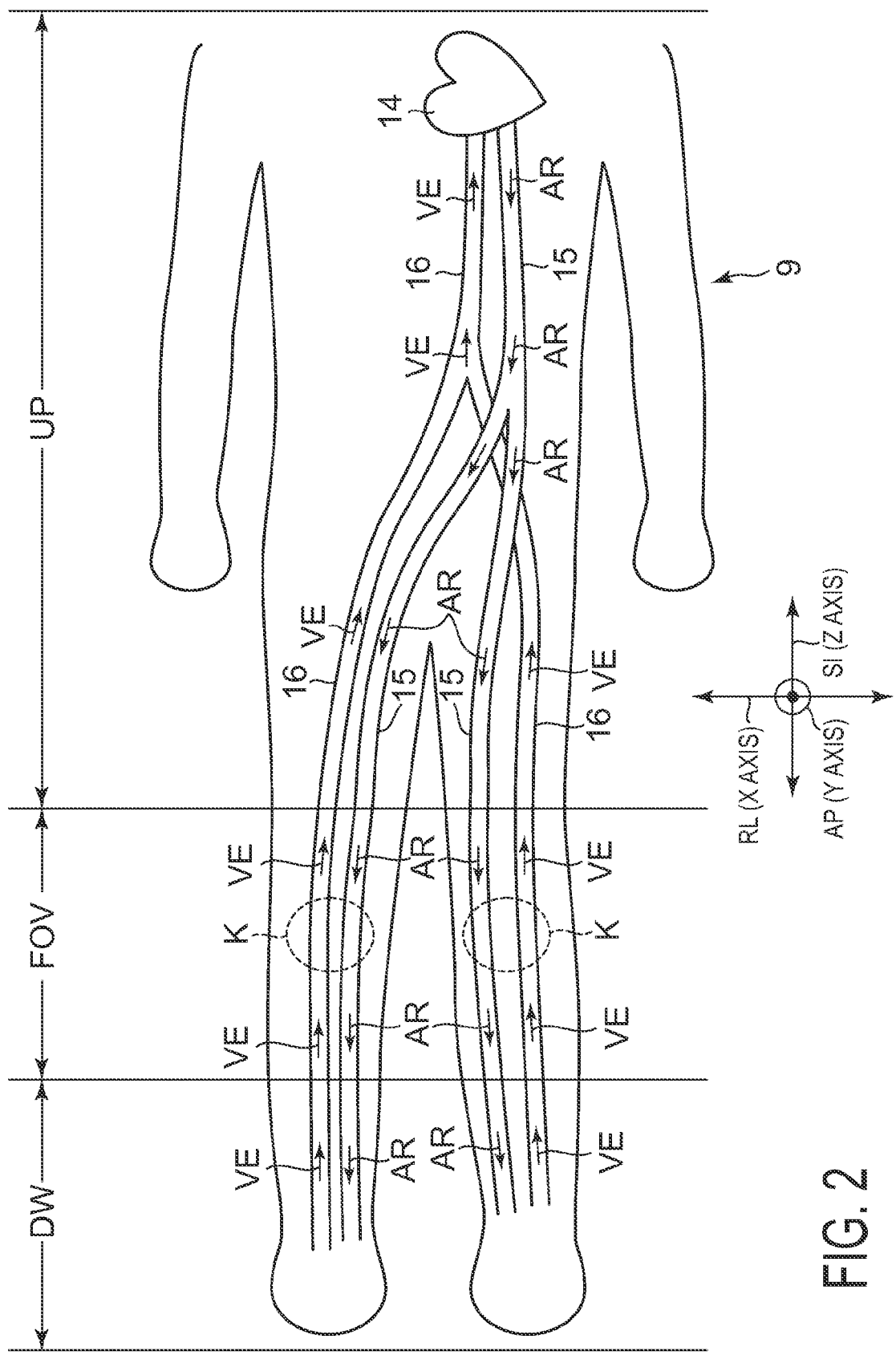
FIG. 2 is a diagram schematically showing a field of view FOV of a subject 9.

FIG. 2 is a diagram schematically showing an imaging field of view FOV of the subject 9.

A heart 14, arteries 15 and veins 16 are shown in FIG. 2. Arterial blood AR flows from an upstream area UP to a downstream area DW via the field of view FOV. Contrary to the arterial blood AR, venous blood VE flows from the downstream area DW to the upstream area UP via the field of view FOV. In the first embodiment, the field of view FOV contains knees K of the subject 9 and its peripheral regions. A description will hereinafter be made of how an MR image of the arterial blood AR flowing through the field of view FOV is acquired.

Incidentally, the venous blood VE untargeted for imaging is also contained in the field of view FOV in addition to the arterial blood AR targeted for imaging. Since the first embodiment considers that the arterial blood AR is represented, it becomes difficult to visually identify the state of the bloodstream of the arterial blood AR if the venous blood VE is also represented together with the arterial blood AR. Accordingly, there is a need to avoid the representation of the venous blood VE untargeted for imaging as much as possible. Therefore, when the arterial blood AR is imaged, the following pulse sequence is executed in the first embodiment.

FIGS. 3A-3C are diagrams for describing a pulse sequence for imaging the arterial blood AR.

FIG. 3A is a graph showing an electrocardiac waveform ECG of the subject 9, FIG. 3B is a pulse sequence PS for imaging the arterial blood AR, and FIG. 3C is a diagram showing a longitudinal magnetization recovery curve Car of the arterial blood AR and a longitudinal magnetization recovery curve Cve of the venous blood VE.

The pulse sequence PS is executed in sync with the electrocardiac waveform ECG. The pulse sequence PS contains a longitudinal magnetization adjusting sequence 21, a reverse pulse 22 and a data acquiring sequence 23.

The longitudinal magnetization adjusting sequence 21 is of a sequence for adjusting a longitudinal magnetization component Mz of the arterial blood AR to Mz=0 (or value near Mz=0) while keeping a longitudinal magnetization component Mz of the venous blood VE at Mz=1 (or value near Mz=1). The reverse pulse 22 is of a pulse for inverting the longitudinal magnetization of the arterial blood AR and the venous blood VE after the longitudinal magnetization adjusting sequence 21 has been executed. The data acquiring sequence 23 is of a sequence for acquiring data for embedding a k space.

Magnetization behaviors of spins of the venous blood VE and the arterial blood AR at the time that the pulse sequence PS has been executed will next be explained in brief with reference to FIG. 3C.

Assume that the longitudinal magnetization components Mz of the venous blood VE and the arterial blood AR are Mz=1 at a time ta prior to the start of the longitudinal magnetization adjusting sequence 21. At a time t1, however, the longitudinal magnetization adjusting sequence 21 is executed. The longitudinal magnetization adjusting sequence 21 is of a sequence for setting the longitudinal magnetization component Mz of the venous blood VE to Mz=1 (or a value near Mz=1) and setting the longitudinal magnetization component Mz of the arterial blood AR to Mz=0 (or a value near Mz=0). Thus, when the longitudinal magnetization adjusting sequence 21 is completed, the longitudinal magnetization component Mz of the venous blood VE is Mz=1 (or a value near Mz=1), whereas the longitudinal magnetization component Mz of the arterial blood AR becomes Mz=0 (or a value near Mz=0). Incidentally, a specific configuration of the longitudinal magnetization adjusting sequence 21 will be explained in detail later.

After the longitudinal magnetization adjusting sequence 21 has been completed, the longitudinal magnetization component Mz of the venous blood VE is inverted from Mz=1 to Mz=−1 by the reverse pulse 22 (time tb). Thereafter, the longitudinal magnetization component is brought to a longitudinal magnetization recovery again and reaches a null point at a time tc.

On the other hand, during a period from the completion of the longitudinal magnetization adjusting sequence 21 to the transmission of the reverse pulse 22, the longitudinal magnetization component Mz of the arterial blood AR is recovered from Mz=0 to Mz=m1 and inverted from Mz=m1 to Mz=−m1 by the reverse pulse 22. Since, however, a waiting time Tw1 between the longitudinal magnetization adjusting sequence 21 and the reverse pulse 22 is a very short time (a few msec), the value of m1 is a value near zero. Accordingly, the value of −m1 is also a value near zero. The longitudinal magnetization component Mz of the arterial blood AR inverted to Mz=−m1 is brought to a longitudinal magnetization recovery and recovered to Mz=m2 at the time tc.

The execution of the data acquiring sequence 23 is started at the time tc and ends at a time td.

At the data acquisition start time tc, the longitudinal magnetization component Mz of the arterial blood AR is 0.5 or so, whereas the longitudinal magnetization component Mz of the venous blood VE is Mz=0. Thus, an MR image in which the arterial blood AR is emphasized and the venous blood VE is suppressed can be obtained by acquiring data at the data acquisition start time tc.

Incidentally, in the first embodiment, a sequence shown in FIGS. 4A and 4B to be described later is used as the longitudinal magnetization adjusting sequence 21. Using the longitudinal magnetization adjusting sequence 21 shown in FIGS. 4A and 4B brings about the effect that it is possible to reduce the unevenness in signal intensity due to variations (B1 ununiformity) in B1 intensity within the bore 21 (refer to FIG. 1). The reason why such an effect is obtained will be explained.

FIGS. 4A and 4B are diagrams for describing a concrete configuration of the longitudinal magnetization adjusting sequence 21.

The longitudinal magnetization adjusting sequence 21 has RF pulses 90° x, α1° y, α2° y, −α1° y, −α2° y and −90° x. The respective RF pulses will be explained below.

FIG. 5 is a diagram for describing the RF pulses 90° x, α1° y, α2° y, −α1° y, α2° y and −90° x.

The RF pulse 90° x is of an RF pulse that coincides with an x axis in phase at a flip angle 90° and is transmitted during a period from times t1 to t3. A central time point of the RF pulse 90° x is t2.

The RF pulse α1° y is of an RF pulse that coincides with a y axis in phase at a flip angle α1° (i.e., it is shifted 90° from the x axis) and is transmitted during a period from times t4 through t6. A central time point of the RF pulse α1° y is t5. A time interval Δt between the RF pulses α1° y and 90° x is Δt=Δt1. Incidentally, the flip angle α1° is a flip angle smaller than 180° by Δd1°. It is expressed in the following equation (1):

$$\alpha 1°=180°-\Delta d1°$$ (1)

where 0<Δd1°<180°

The RF pulse α2° y is of an RF pulse that coincides with the y axis in phase at a flip angle α2° (i.e., it is shifted 90° from the x axis) and is transmitted during a period from times t7 through t9. A central time point of the RF pulse α2° y is t8. A time interval Δt between the RF pulses α2° y and α1° y is Δt=Δt2. Incidentally, the flip angle α2° is a flip angle larger than 180° by Δd2°. It is expressed in the following equation (2):

$$\alpha 2°=180°+\Delta d2°$$ (2)

where 0<Δd2°<180°

The RF pulse −α1° y is of an RF pulse that coincides with the y axis in phase at a flip angle −α1° (i.e., it is shifted 90° from the x axis) and is transmitted between times t10 and t12. A central time point of the RF pulse −α1° y is t11. A time interval Δt between the RF pulses −α1° y and α2° y is Δt=Δt3.

Incidentally, the flip angle −α1° is a flip angle identical in absolute value to the flip angle α1° although opposite in sign thereto. It is expressed in the following equation (3):

$$-\alpha 1°=-1(180°-\Delta d1°)$$ (3)

where 0<Δd1°<180°

The RF pulse −α2° y is of an RF pulse that coincides with the y axis in phase at a flip angle −α2° (i.e., it is shifted 90° from the x axis) and is transmitted between times t13 and t15. A central time point of the RF pulse −α2° y is t14. A time interval Δt between the RF pulses −α2° y and −α1° y is Δt=Δt4. Incidentally, the flip angle −α2° is a flip angle identical in absolute value to the flip angle α2° although opposite in sign thereto. It is expressed in the following equation (4):

$$-\alpha 2°=-1(180°+\Delta d2°)$$ (4)

where 0<Δd2°<180°

The RF pulse −90° x is of an RF pulse that coincides with the x axis in phase at a flip angle −90° and is transmitted between times t16 and t18. A central time point of the RF pulse −90° x is t17. A time interval Δt between the RF pulses −90° x and −α2° y is Δt=Δt5.

The time intervals Δt1, Δt2, Δt3, Δt4 and Δt5 among the RF pulses 90° x, α1° y, α2° y, −α1° y, −α2° y and −90° x are set in such a manner that the following relationship is established:

$$\Delta t1:\Delta t2:\Delta t3:\Delta t4:\Delta t5=1:2:2:2:1$$

The longitudinal magnetization adjusting sequence 21 has a crusher gradient pulse Gcrush and a velocity encode gradient pulse Gv as shown in FIG. 3C. The crasher gradient pulse Gcrush is applied in right-and-left directions RL, and the velocity encode gradient pulse Gv is applied in up-and-down directions SI (refer to FIG. 2). The crusher gradient pulse Gcrush is applied to cause transverse magnetization of each spin of the arterial blood AR to disappear with respect to the right-and-left directions RL. The velocity encode gradient pulse Gv is applied to shift the phase of each spin of the arterial blood AR and the phase of each spin of the venous blood VE by 180° from each other with respect to the up-and-down directions SI.

The longitudinal magnetization adjusting sequence 21 is configured in the above-described manner.

In the first embodiment, the longitudinal magnetization adjusting sequence 21 uses the RF pulses α1° y, α2° y, −α1° y and −α2° y having the flip angles shifted from 180° as shown in FIG. 4B. Using such a longitudinal magnetization adjusting sequence 21 brings about the effect that it is possible to reduce unevenness in signal intensity due to variations in B1 intensity (B1 ununiformity) within the bore 21. In order to describe the reason why such an effect is obtained, the behaviors of spins at the time that the variations in B1 intensity have occurred within the bore 21 will be described with reference to FIGS. 6A-6C.

Figure 6:
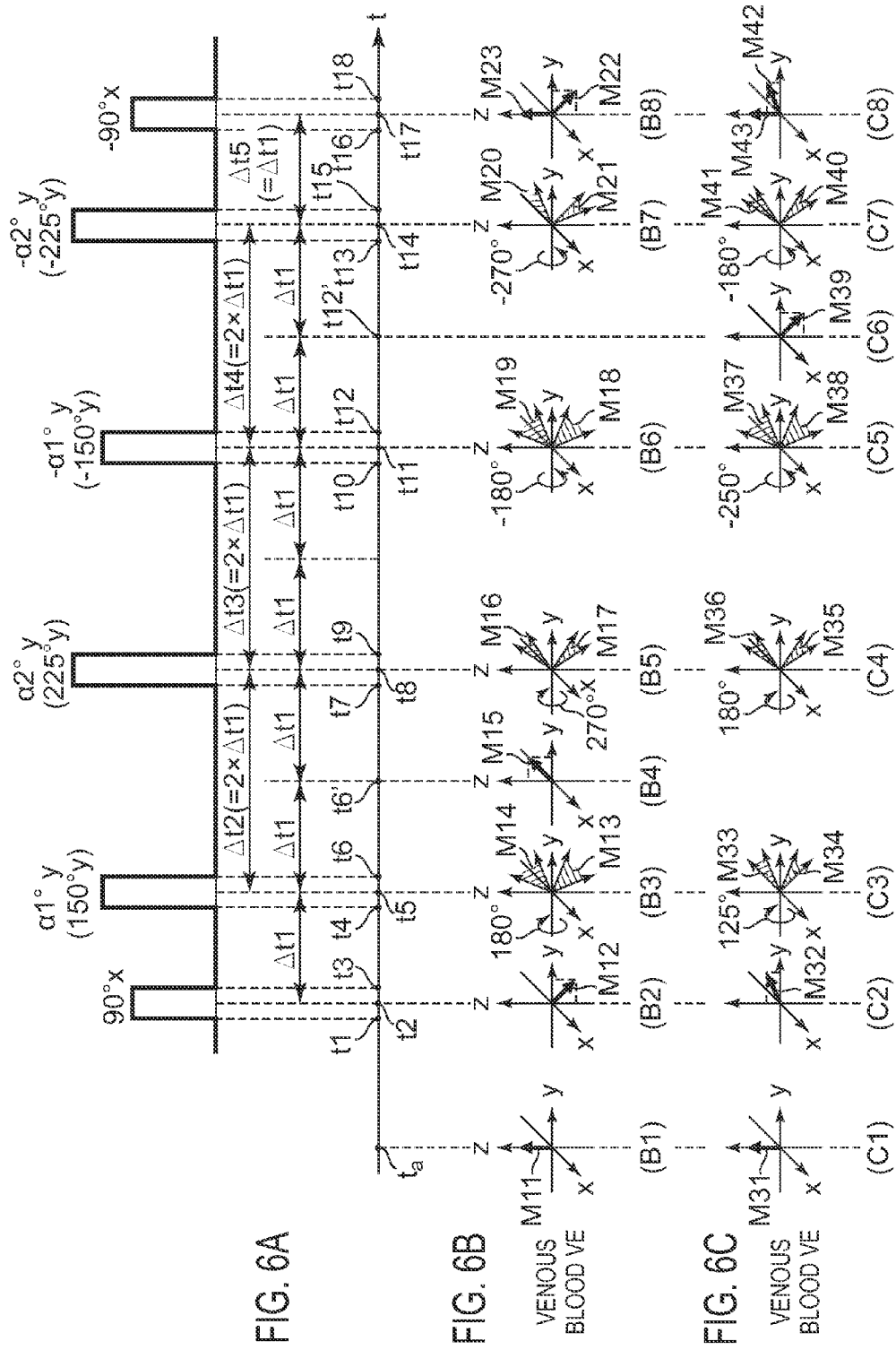
FIGS. 6A, 6B, and 6C are diagrams showing behaviors of spins while the longitudinal magnetization adjusting sequence 21 is being executed.

FIGS. 6A-6C are diagrams showing the behaviors of spins while the longitudinal magnetization adjusting sequence 21 is being executed.

FIG. 6A is a diagram showing the longitudinal magnetization adjusting sequence 21, and FIGS. 6B and 6C are diagrams showing the behaviors of spins in the venous blood VE lying within the bore 21.

FIG. 6A shows only the RF pulses. FIG. 6B shows the behaviors of spins of the venous blood VE at a position where the value of a B1 intensity becomes larger by 20% than the ideal value of the B1 intensity. FIG. 6C shows the behaviors of spins of the venous blood VE at a position where the value of the B1 intensity is lowered by 20% than the ideal value of the B1 intensity.

The behaviors of the spins in FIGS. 6B and 6C will be explained below.

Incidentally, assume that for convenience of explanation below, the flip angles α1°, α2°, −α1° and −α2° of the RF pulses α1° y, α2° y, −α1° y and −α2° y are indicative of the following values:
α1°=150°(Δd1°=30° in the equation (1))
α2°=225°(Δd2°=45° in the equation (2))
−α1°=−1°=−150°(Δd1°=30° in the equation (3)), and
−α2°=−α2°=−225°(Δd2°=45° in the equation (4))

The behaviors of spins at the position where the value of B1 intensity becomes larger by 20% than the ideal value of B1 intensity will now be discussed with reference to FIG. 6B.

(i) Time Ta

Since the longitudinal magnetization adjusting sequence 21 is not yet started at the time ta, a magnetization vector M11 of spins is indicative of magnetization in a Z direction (longitudinal magnetization component) (refer to a spin state B1).

(ii) Time t2 (Times t1 Through t3)

Since the R pulse 90° x is transmitted between the times t1 and t3, the spins are flipped about the x axis and the magnetization vector M11 of the spins changes to a magnetization vector M12 (incidentally, the spins are assumed to be flipped momentarily at the central time point t2 of the RF pulse 90° x for convenience of description). However, at the position where the value of the B1 intensity becomes larger by 20% than the ideal value of the B1 intensity, the flip angle of the spins is not brought to 900 but to 1080 (=90°×1.2) larger by 20% than 90° (refer to a spin state B2).

(ii) Time t2 Through t5

Magnetization M12 of the spins at the time t2 is dispersed in the phase of transverse magnetization thereof as time advances and is thereby brought to magnetization M13 (refer to a spin state B3).

(iii) Time t5 (Times t4 Through t6)

Since the RF pulse 150° y is transmitted between the times t4 and t6, the spins are flipped about the y axis and a magnetization vector M13 of the spins changes to a magnetization vector M14 (incidentally, the spins are assumed to be flipped momentarily at the central time point t5 of the RF pulse 150° y for convenience of description). However, at the position where the value of the B1 intensity becomes larger by 20% than the ideal value of the B1 intensity, the flip angle of the spins is not brought to 1500 but to 180°(=150°×1.2) larger by 20% than 150° (refer to the spin state B3).

(iv) Times t5 Through t6'

At the time t5, the spins are being flipped 180°. Accordingly, the dispersion of the phase of the transverse magnetization of the spins that has occurred between the times t2 and t5 (time Δt1) is cancelled out between the times t5 and t6' (time Δt1). The dispersed transverse magnetization of spins is focused at the time t6' and is thereby brought to magnetization M15 (refer to a spin state B4).

(v) Times t6' Through t8

The magnetization M15 of the spins, which has been focused at the time t6', is dispersed in the phase of transverse magnetization thereof as time advances and is thereby brought to magnetization M16 (refer to a spin state B5).

(vi) Time t8 (Times t7 Through t9)

Since the RF pulse 225° y is transmitted between the times t7 and t9, the spins are flipped about the y axis and the magnetization M16 of the spins changes to magnetization M17 (incidentally, the spins are assumed to be flipped momentarily at the central time point t8 of the RF pulse 225° y for convenience of description). However, at the position where the value of the B1 intensity becomes larger by 20% than the ideal value of the B1 intensity, the flip angle of the spins is not brought to 2250 but to 2700 (=225°×1.2) larger by 20% than 225° (refer to the spin state B5).

(vii) Times t8 Through t11

The magnetization M17 of the spins, which has been flipped at the time t8, is dispersed in the phase of transverse magnetization thereof as time advances and is thereby brought to magnetization M18 (refer to a spin state B6).

(viii) Time t11 (Times t10 Through t12)

Since the RF pulse −150° y is transmitted between the times t10 and t12, the spins are flipped about the y axis and the magnetization M18 of the spins changes to magnetization M19 (incidentally, the spins are assumed to be flipped momentarily at the central time point t11 of the RF pulse −150° y for convenience of description). However, at the position where the value of the B1 intensity becomes larger by 20% than the ideal value of the B1 intensity, the flip angle of the spins is not brought to −150° but to −180° (=−150°× 1.2) larger by 20% than −150° (refer to the spin state B6).

(ix) Times t11 Through t14

At the time t11, the spins are being flipped −180°. Accordingly, the dispersion of the phase of the transverse magnetization of the spins that has occurred between the times t8 and t11 (time Δt3=2×Δt1) is cancelled out between the times t11 and t14 (time Δt4=2×Δt1). The magnetization M19 of the spins changes to magnetization M20.

(x) Time t14 (Times t13 Through t15)

Since the RF pulse −225° y is transmitted between the times t13 and t15, the spins are flipped about the y axis and the magnetization vector M20 of the spins changes to a magnetization vector M21 (incidentally, the spins are assumed to be flipped momentarily at the central time point t14 of the RF pulse −225° y for convenience of description). However, at the position where the value of the B1 intensity becomes larger by 20% than the ideal value of the B1 intensity, the flip angle of the spins is not brought to −225° but to −270° (=−225°×1.2) larger by 20% than −225° (refer to a spin state B7).

(xi) Times t14 Through t17

The dispersion of the phase of the transverse magnetization of the spins that has occurred between the times t6' and t8 (time Δt1) is cancelled out between the times t14 and t17 (time Δt5=Δt1). Accordingly, the transverse magnetization of the spins is focused at the time t17 and is thereby brought to magnetization M22 (refer to a spin state B8).

(xii) Time t17 (Times t16 Through t18)

Since the RF pulse −90° x is transmitted between the times t16 and t18, the spins are flipped about the x axis and the magnetization vector M22 of the spins changes to magnetization M23 (incidentally, the spins are assumed to be flipped momentarily at the central time point t17 of the RF pulse −90° x for convenience of description). However, at the position where the value of the B1 intensity becomes larger by 20% than the ideal value of the B1 intensity, the flip angle of the spins is not brought to −90° but to −108° (=−90°×1.2) larger by 20% than −90°. Thus, since the magnetization M23 is oriented in the Z-axis direction, the longitudinal magnetization component Mz of each spin is brought to Mz=1 (refer to the spin state B8).

As has been described in each of (i) through (xii), the RF pulse 150° y (−150° y) flips the spins by 180° (−180°) at the position where the value of the B1 intensity becomes larger by 20% than the ideal value of the B1 intensity. Accordingly, even in the position where the value of the B1 intensity becomes larger by 20% than the ideal value of the B1 intensity, the longitudinal magnetization component Mz of each spin can be brought to Mz=1 (refer to the time t18 of the longitudinal magnetization recovery curve Cve shown in FIG. 3).

The behaviors of spins at the position where the value of B1 intensity is lowered by 20% than the ideal value of B1 intensity will now be discussed with reference to FIG. 6C.

Since the behaviors of the spins in FIG. 6C can be described in a manner similar to the behaviors of the spins in FIG. 6C, they will be explained in brief.

Since the longitudinal magnetization adjusting sequence 21 is not yet started at the time ta, a magnetization vector M31 of spins is indicative of magnetization (longitudinal magnetization component) in the Z direction (refer to a spin state C1). Thereafter, the RF pulse 90° x is transmitted between the times t1 and t3, and the magnetization vector M31 of the spins changes to a magnetization vector M32. However, at the position where the value of the B1 intensity is lowered by 20% than the ideal value of the B1 intensity, the flip angle of the spins is not brought to 900 but to 720 (=90°×0.8) smaller than 90° by 20%, even though the RF pulse 90° x is transmitted (refer to a spin state C2). The magnetization M32 of the spins at the time t2 is dispersed in the phase of transverse magnetization thereof as time advances. However, the magnetization of the spins dispersed between the times t2 and t8 is focused between the times t8 and t12' by the RF pulse 225° y (times t7 through t9) (refer to a spin state C6). The magnetization of the spins dispersed between the times t12' and t14 is focused between the times t14 and t17 by the RF pulse −225° y (times t13 through t15) (refer to a spin state C8). Accordingly, the longitudinal magnetization component Mz of each spin can be brought to Mz=1 even at the position where the value of the B1 intensity is lowered by 20% than the ideal value of the B1 intensity (refer to the time t18 of the longitudinal magnetization recovery curve Cve shown in FIGS. 3A-3C).

It is understood from the explanations of FIGS. 6B and 6C that even though the value of the B1 intensity becomes larger by 20% than the ideal value of the B1 intensity and the value thereof is lowered by 20% than that in reverse, the longitudinal magnetization component Mz of each spin reaches Mz=1. Thus, the flip angles α1°, α2°, −α1° and −α2° of the longitudinal magnetization RF pulses α1° y, α2° y, −α1° y and −α2° y of the spins are shifted from 180° and −180°, thereby making it possible to reduce unevenness in signal intensity due to B1 ununiformity. In order to verify the above consideration, simulations were performed on the signal intensities where the longitudinal magnetization sequence 21 was executed. The simulations will be explained below.

Figure 7:
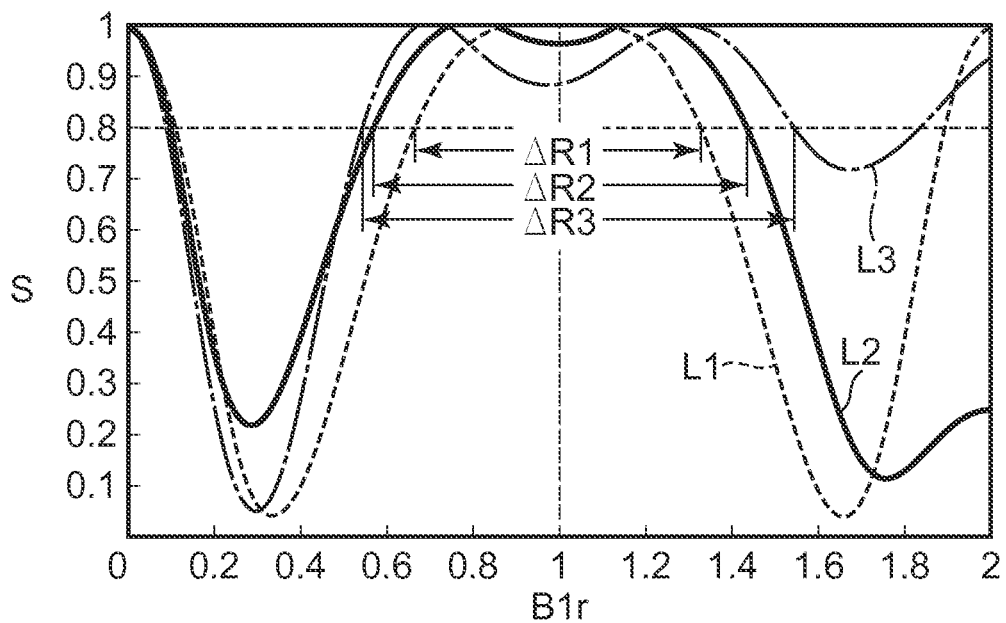
FIG. 7 is a graph showing simulation results.

FIG. 7 is a graph showing simulation results.

The horizontal axis of the graph indicates a transmission magnetic field strength ratio B1r at each pixel within the field of view FOV, and the vertical axis thereof indicates integral values S of signal intensities at the respective pixels within the field of view FOV.

Incidentally, the transmission magnetic field strength ratio B1r is expressed in the following equation:

$$B1r=B1x/B1a \quad (5)$$

where B1a: ideal value of transmission magnetic field strength where no B1 ununiformity exists, and B1x: transmission magnetic field strength at each pixel within field of view FOV where B ununiformity exists.

Thus, when a transmission magnetic field strength B1x at a predetermined pixel in the field of view FOV coincides with the ideal value B1a of the transmission magnetic field strength, a transmission magnetic field strength ratio is B1r=1 at the predetermined pixel. When, however, the transmission magnetic field strength B1x at the predetermined pixel in the field of view FOV is shifted from the ideal value B1a of the transmission magnetic field strength, the transmission magnetic field strength ratio is B1r≠1 at the predetermined pixel. Specifically, when the transmission magnetic field strength B1x at the predetermined pixel in the field of view FOV becomes larger than the ideal value B1a of the transmission magnetic field strength, the transmission magnetic field strength ratio is B1r>1 at the predetermined pixel. When, for example, the transmission magnetic field strength B1x at the predetermined pixel in the field of view FOV becomes larger by 20% than the ideal value B1a of the transmission magnetic field strength, the transmission magnetic field strength ratio is B1r=1.2 at the predetermined pixel. On the other hand, when the transmission magnetic field strength B1x at the predetermined pixel in the field of view FOV becomes smaller than the ideal value B1a of the transmission magnetic field strength, the transmission magnetic field strength ratio is B1r<1 at the predetermined pixel. When, for example, the transmission magnetic field strength B1x at the predetermined pixel in the field of view FOV is lowered by 20% than the ideal value B1a of the transmission magnetic field strength, the transmission magnetic field strength ratio is B1r=0.8 at the predetermined pixel.

Three lines L1, L2 and L3 each indicative of the relationship between the transmission magnetic field strength ratio B1r and the integral value S of each signal intensity are show in the graph. Under simulation conditions of the three lines L1, L2 and L3, the values of the flip angles α1°, α2°, −α1° and −α2° of the RF pulses α1° y, α2° y, −α1° y and −α2° y are different from one another. The values of the flip angles α1°, α2°, −α1° and −α2° with respect to the three lines L1, L2 and L3 are as follows:

(1) Line L1

$$(α1°,α2°,-α1°,-α2°)=(180°,180°,-180° \text{ and } -180°) \quad (6)$$

(2) Line L2

$$(α1°,α2°,-α1°,-α2°)=(150°,225°,-150° \text{ and } -225°) \quad (7)$$

(3) Line L3

$$(α1°,α2°,-α1°,-α2°)=(138°,257°,-138° \text{ and } -257°) \quad (8)$$

Ranges ΔR1, ΔR2 and ΔR3 each taken for the transmission magnetic field strength ratio B1r at which the integral value S of the signal intensity becomes 0.8 or more in the vicinity of the transmission magnetic field strength ratio B1r=1 are shown in FIG. 7 for every L1, L2, L3 of lines.

Comparing the ranges ΔR1, ΔR2 and ΔR3 taken for the transmission magnetic field strength ratios B1r at the individual lines L1, L2 and L3 with one another shows that the ranges ΔR2 and ΔR3 for the lines L2 and L3 become wider than the range ΔR1 for the line L. It is thus understood that unevenness in signal intensity due to B1 ununiformity can be reduced by shifting the flip angles (α1°, α2°, −α1° and −α2°) from 180° and −180°.

Incidentally, the lines L2 and L3 become smaller than the line L1 in the integral value S of the signal intensity when the transmission magnetic field strength ratio B1r=1. Since, however, the integral value S of the signal intensity at the transmission magnetic field strength ratio B1r=1 is S>0.8 even in the case of the lines L2 and L3, the signal intensity is considered to have sufficient magnitude. Thus, even if the integral value S of the signal intensity is S<1 when the transmission magnetic field strength ratio B1r=1, unevenness in signal intensity due to B1 ununiformity can be reduced sufficiently.

Although the venous blood VE has been mentioned in the above description, unevenness in signal intensity due to B1 ununiformity can sufficiently be reduced in like manner even with respect to the arterial blood ΔR. In the case of the arterial blood ΔR that flows at a flow velocity sufficiently faster than that for the venous blood VE, its transverse magnetization is cancelled out by a crusher gradient pulse Gcrush and a velocity gradient pulse Gv. Therefore, the transverse magnetization becomes small sufficiently until the last RF pulse −90° x is transmitted. Thus, even if the RF pulse −90° x is transmitted, the longitudinal magnetization component Mz of the arterial blood ΔR becomes Mz=0 (or a value near Mz=0) (refer to the time t18 of the longitudinal magnetization recovery curve Car shown in FIGS. 3A-3C).

Using the longitudinal magnetization adjusting sequence 21 as described above makes it possible to sufficiently reduce the unevenness in signal intensity due to the B1 ununiformity with respect to both the venous blood VE and the arterial blood ΔR different in flow velocity and thereby obtain a high quality image.

(2) Second Embodiment

In the first embodiment, the flip angles α1°, α2°, −α1° and −α2° of the RF pulses α1° y, α2° y, −α1° y and −α2° y are expressed in the equations (1) through (4). These equations (1) through (4) are summarized as follows: A combination of the flip angles α1°, α2°, −α1° and −α2° is expressed in the following equation (9):

$$(\alpha1°, \alpha2°, -\alpha1°, -\alpha2°) = (180°-\Delta d1°, 180°+\Delta d2°, -(180°-\Delta d1°), -(180°+\Delta d2°)) \quad (9)$$

The combination of the flip angles α1°, α2°, −α1° and −α2° may, however, be another combination than the equation (5). The second embodiment will explain a case in which a combination expressed in the following equation (10) as another combination of the flip angles α1°, α2°, −α1° and −α2°.

$$(\alpha1°, \alpha2°, -\alpha1°, -\alpha2°) = (180°+\Delta d1°, -(180°-\Delta d2°), -(180°+\Delta d1°), 180°-\Delta d2°) \quad (10)$$

where 0°<Δd1° and Δd2°<180°

Figure 8:
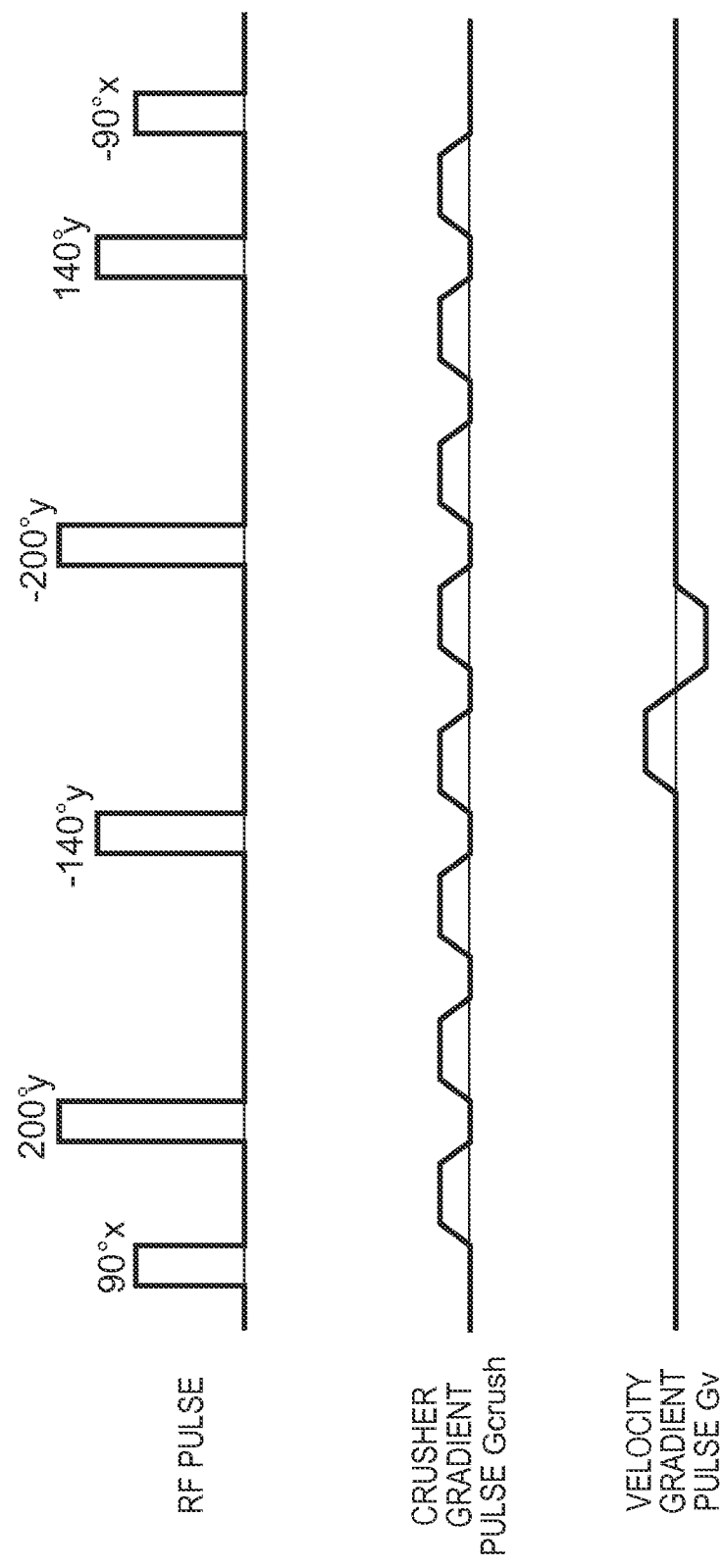
FIG. 8 is a diagram illustrating one example of the longitudinal magnetization adjusting sequence 21 where a combination of flip angles expressed in an equation (10) is used.

FIG. 8 is a diagram showing one example of the longitudinal magnetization adjusting sequence 21 where the combination of the flip angles expressed in the equation (10) is used.

Values obtained when Δd1°=20° and Δd2°=40° are respectively substituted into Δd1° and Δd2° of the equation (10) are used in FIG. 8 (refer to the following equation (10')).

$$(\alpha1°, \alpha2°, -\alpha1°, -\alpha2°) = (180°+\Delta d1°, -(180°-\Delta d2°), -(180°+\Delta d1°), 180°-\Delta d2°) = (200°, -140°, -200°, 140°)$$

Next, simulations for examining unevenness in signal intensity due to B1 ununiformity where the flip angles expressed in the equation (10)' were used were done. The simulations will be explained below.

Figure 9:
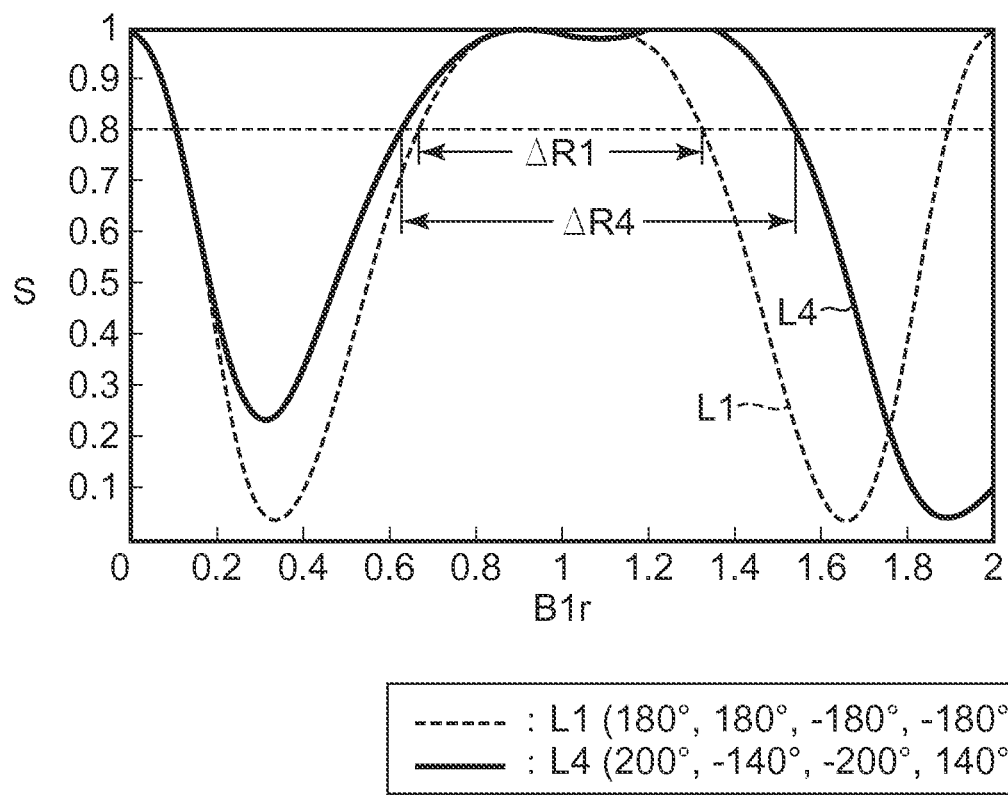
FIG. 9 is a graph showing simulation results.

FIG. 9 is a graph showing simulation results.

Two lines L and L4 each indicative of the relationship between a transmission magnetic field strength ratio B1r and an integral value S of each signal intensity are shown in the graph.

The line L1 is identical to the line L shown in FIG. 7 and indicates a simulation result obtained when flip angles (180°, 180°, −180° and −180°) are used. On the other hand, the line L4 indicates a simulation result obtained when the flip angles (200°, −140°, −200° and 140°) expressed in the equation (10)' are used.

Ranges ΔR1 and ΔR4 each taken for the transmission magnetic field strength ratio B1r at which the integral value S of the signal intensity becomes 0.8 or more in the vicinity of the transmission magnetic field strength ratio B1r=1 are shown in FIG. 9 for every L1 and L4 of lines.

Comparing the ranges ΔR1 and ΔR4 taken for the transmission magnetic field strength ratios B1r at the individual lines L1 and L4 with each other shows that the range ΔR4 for the line L4 becomes wider than the range ΔR1 for the line L. Thus, even in the second embodiment, unevenness in signal intensity due to B1 ununiformity can be reduced in a manner similar to the first embodiment.

Incidentally, when the subject is imaged by a 3T (Tesla) magnetic resonance imaging apparatus, there is a tendency that the transmission magnetic field strength ratio B1r becomes larger with the approach from the body surface of the subject to the internal center of the subject. It is thus desired that when the subject is imaged by the 3T (Tesla) magnetic resonance imaging apparatus, the integral value S of the signal intensity has as large a value as possible to obtain a high quality image even in the vicinity of the internal center of the subject even though the value of the transmission magnetic field strength ratio B1r becomes larger. In the line L1, however, the integral value S of the signal intensity becomes smaller than 0.8 from the vicinity when the transmission magnetic field strength ratio B1r exceeds B1r=1.3. In the line L4, contrary to this, the integral value S of the signal intensity can be set to 0.8 or more up to the vicinity of the transmission magnetic field strength ratio B1r=1.6. Thus, when the subject is imaged by the 3T (Tesla) magnetic resonance imaging apparatus, unevenness in signal intensity due to B1 ununiformity can be reduced efficiently even in the neighborhood of the internal center of the subject by using the flip angles (200°, −140°, −200° and 140°).

In the first embodiment, the combination of the flip angles (α1°, α2°, −α1° and −α2°) expressed in the equation (9) is used. In the second embodiment, the combination of the flip angles (α1°, α2°, −α1° and −α2°) expressed in the equation (10) is used. The combination of the flip angles is, however, not limited to the equations (9) and (10). Combinations of flip angles expressed in the following equations (11) through (16) are possible:

$$(\alpha1°, \alpha2°, -\alpha1°, -\alpha2°) = (-(180°-\Delta d1°), -(180°+\Delta d2°), 180°-\Delta d1°, 180°+\Delta d2°) \quad (11)$$

$$(\alpha1°, \alpha2°, -\alpha1°, -\alpha2°) = (-(180°+\Delta d1°), 180°-\Delta d2°, 180°+\Delta d1°, -(180°-\Delta d2°)) \quad (12)$$

$$(\alpha1°, \alpha2°, -\alpha1°, -\alpha2°) = (180°+\Delta d1°, 180°-\Delta d2°, -(180°+\Delta d1°), -(180°-\Delta d2°)) \quad (13)$$

$$(\alpha1°, \alpha2°, -\alpha1°, -\alpha2°) = (180°-\Delta d1°, -(180°+\Delta d2°), -(180°-\Delta d1°), 180°+\Delta d2°) \quad (14)$$

$$(\alpha1°, \alpha2°, -\alpha1°, -\alpha2°) = (-(180°+\Delta d1°), -(180°-\Delta d2°), 180°+\Delta d1°, 180°-\Delta d2°) \quad (15)$$

$$(\alpha1°, \alpha2°, -\alpha1°, -\alpha2°) = (-(180°-\Delta d1°), 180°+\Delta d2°, 180°-\Delta d1°, -(180°+\Delta d2°)) \quad (16)$$

In the first and second embodiments, (α1°, α2°, −α1°, −α2°) are used as each combination of the flip angles. A combination of (α1°, α2°, α1° and α2°) may, however, be used instead of (α1°, α2°, −α1° and −α2°)

Further, in the first and second embodiments, the phases θ1° and θ2° of RF pulses $\alpha1°_{\theta1°}$, $\alpha2°_{\theta2°}$, $-\alpha1°_{\theta1°}$ and $-\alpha2°_{\theta}$ are θ1°=θ2°=y (i.e., they are coincident with the y axis shifted 90° with respect to the x axis). There is, however, no need to cause the phases θ1° and θ2° of the RF pulses $\alpha1°_{\theta1°}$, $\alpha2°_{\theta2°}$, $-\alpha1°_{\theta1°}$, and $\alpha2°_{\theta2°}$ to coincide with the y axis shifted 90° with respect to the x axis. They may be used as a phase shifted $\theta°$ ($0 \leq \theta° < 90°$) with respect to the x axis. It is also unnecessary to set the phases as $\theta1° = \theta2°$. The phases may be taken as $\theta1° \neq \theta2°$.

(3) Third Embodiment

Upon explaining a third embodiment, eddy currents generated by a crusher gradient pulse Gcrush and a velocity encode gradient pulse Gv will first be explained.

Figure 10:
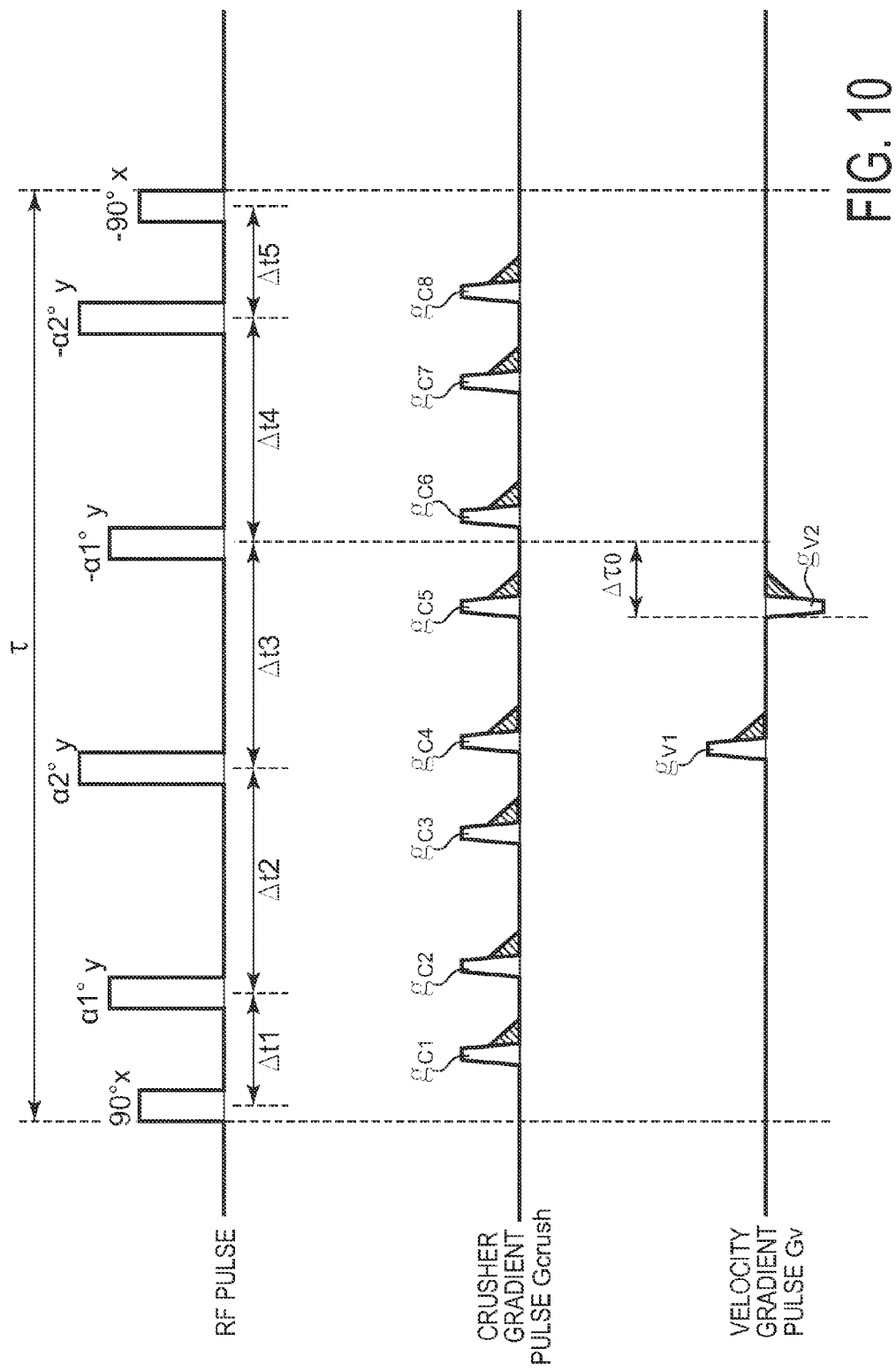
FIG. 10 is diagram for describing eddy currents.

FIG. 10 is a diagram for explaining the eddy currents.

In FIG. 10, each of diagonally-shaded areas shown immediately after gradient pulses schematically shows the occurrence of the eddy current. Shading may occur in an image due to the eddy current. Since the eddy current due to the crusher gradient pulse Gcrush and the eddy current due to the velocity encode gradient pulse Gv are generated in FIG. 10, there are considered shading caused by the eddy current of the crusher gradient pulse Gcrush and shading caused by the eddy current of the velocity encode gradient pulse Gv. Since, however, the eddy current of the crusher gradient pulse Gcrush influences all of four refocus pulses (RF pulses $\alpha1°$ y, $\alpha2°$ y, $-\alpha1°$ y and $-\alpha2°$ y) that exist between RF pulses 90° x and $-90°$ x, they are considered little to result in the occurrence of shading in the image. On the other hand, each eddy current of the velocity encode gradient pulse Gv influences only the third refocus pulse (RF pulse $-\alpha1°$ y), it can result in the occurrence of shading in the image. In order to reduce the shading caused by the eddy current of the velocity encode gradient pulse Gv, the third refocus pulse (RF pulse $-\alpha1°$ y) may be transmitted in wait for the approach of the eddy current generated by a second pulse $g_{v2}$ of the velocity encode gradient pulse Gv. Since it is however necessary to wait for the approach of the eddy current generated by the second pulse $g_{v2}$ of the velocity encode gradient pulse Gv to zero, there is a need to make long a waiting time $\Delta\tau0$ between the second pulse gv2 and the RF pulse $-\alpha1°$ y to some extent. If the waiting time $\Delta\tau0$ is made long since time intervals $\Delta t1$, $\Delta t2$, $\Delta t3$, $\Delta t4$ and $\Delta t5$ respectively defined among the RF pulses are set in such a manner that the relationship of 1:2:2:2:1 is established as described above, then the time intervals $\Delta t1$, $\Delta t2$, $\Delta t3$, $\Delta t4$ and $\Delta t5$ need to be lengthened correspondingly (namely, it is necessary to make the time $\tau$ of a sequence long). Accordingly, a problem arises in that it is not possible to cope with such a case that it is desired to shorten the time $\tau$ of the sequence. The third embodiment will therefore explain a longitudinal magnetization adjusting sequence 21 (refer to FIG. 3) capable of reducing shading and further shortening the time $\tau$ of the sequence.

Figure 11:
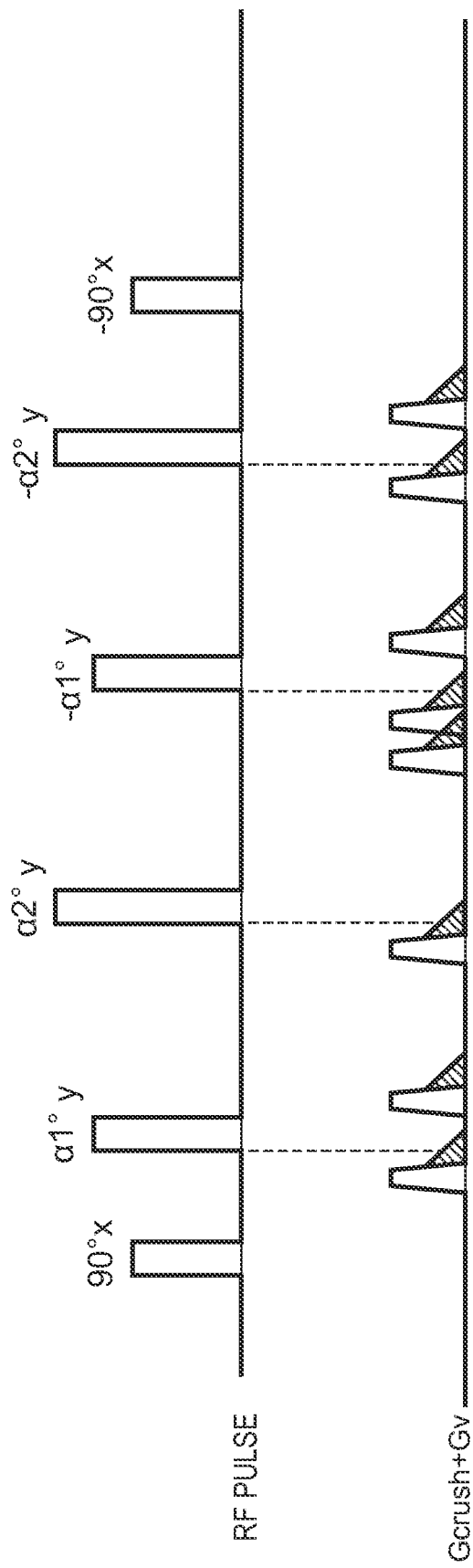
FIG. 11 is one example of a longitudinal magnetization adjusting sequence 21 employed in a third embodiment.

FIG. 11 is one example of a longitudinal magnetization adjusting sequence 21 according to the third embodiment.

In the third embodiment, a crusher gradient pulse Gcrush and a velocity encode gradient pulse Gv are combined together on a single axis. A procedure for generating the crusher gradient pulse Gcrush and velocity encode gradient pulse Gv combined together on the single axis will be explained below with reference to FIGS. 12A-12D.

FIGS. 12A-12D are diagrams for describing the procedure for generating the crusher gradient pulse Gcrush and the velocity encode gradient pulse Gv combined together on the single axis.

Figure 12:
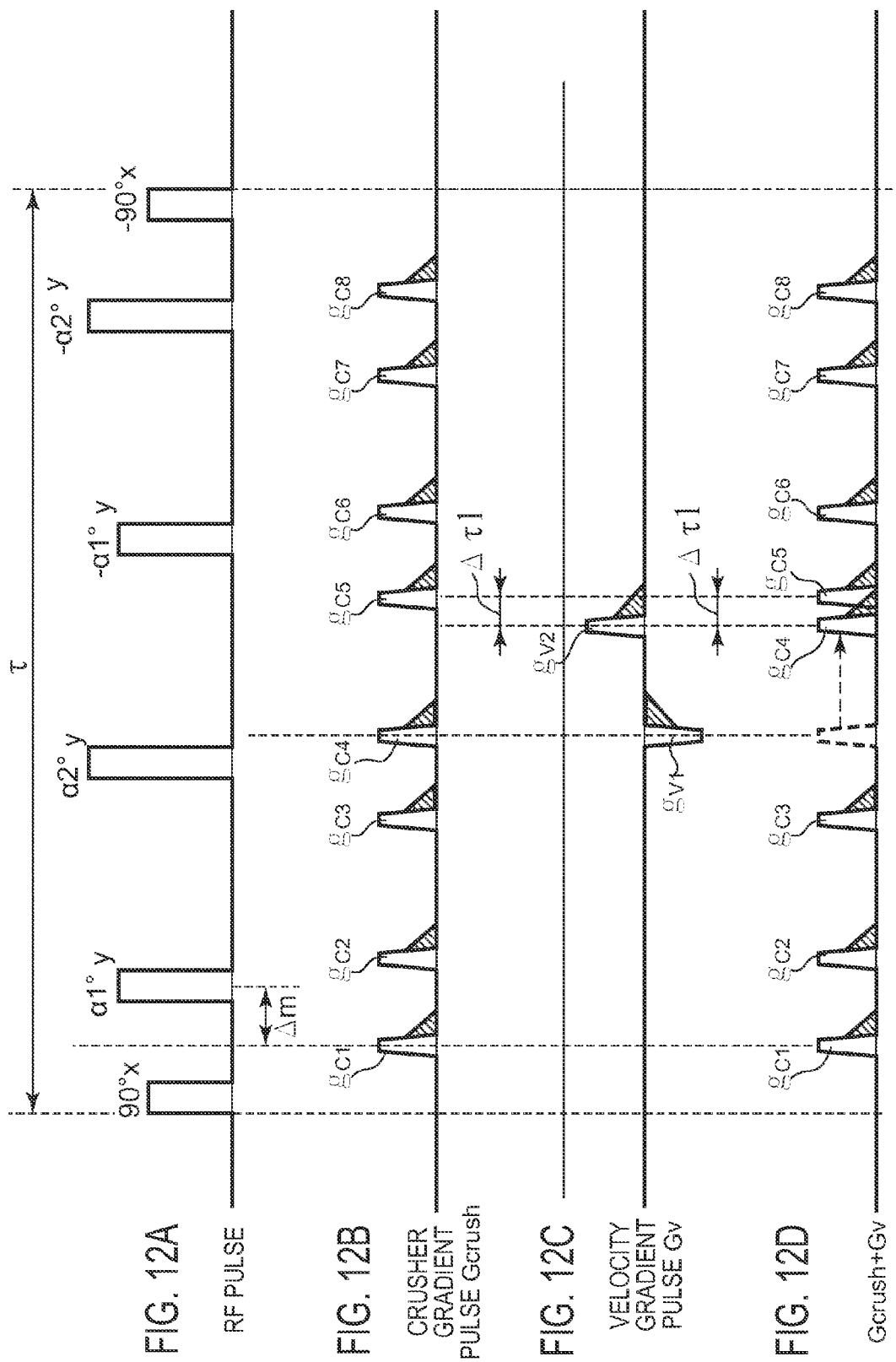
FIGS. 12A, 12B, 12C, and 12D are diagrams for explaining a procedure for generating a crusher gradient pulse Gcrush and a velocity encode gradient pulse Gv combined together on a single axis.

FIG. 12A is a diagram showing RF pulses, FIG. 12B is a diagram showing a pre-combination crusher gradient pulse Gcrush, FIG. 12C is a diagram showing a pre-combination velocity encode gradient pulse Gv, and FIG. 12D is a diagram showing the crusher gradient pulse Gcrush and velocity encode gradient pulse Gv combined together on the one axis.

The pre-combination velocity encode gradient pulse Gv (refer to FIG. 12C) has a negative gradient pulse $g_{v1}$ and a positive gradient pulse $g_{v2}$. The negative gradient pulse $g_{v2}$ is applied at the same time as that for a fourth gradient pulse $g_{c4}$ of the pre-combination crusher gradient pulse Gcrush. The positive gradient pulse $g_{v2}$ is however applied previous to a fifth gradient pulse $g_{c5}$ of the pre-combination crusher gradient pulse Gcrush by a time $\Delta\tau1$. Thus, when the crusher gradient pulse Gcrush shown in FIG. 12B and the velocity encode gradient pulse Gv shown in FIG. 12C are combined together on the signal axis, the crusher gradient pulse Gcrush and velocity encode gradient pulse Gv (hereinafter referred to as "combined gradient pulse Gcrush+Gv") combined on the single axis, which are shown in FIG. 12C, are obtained.

The combined gradient pulse Gcrush+Gv can be obtained by causing the fourth gradient pulse $g_{c4}$ of the crusher gradient pulse Gcrush to be moved to the position of the positive gradient pulse $g_{v2}$ of the velocity encode gradient pulse Gv (to approach the fifth gradient pulse $g_{c5}$).

Even though the crusher gradient pulse Gcrush and the velocity encode gradient pulse Gv are combined together on the one axis, the effect of the velocity encode gradient pulse Gv can be maintained as it is. It is understood that referring to FIGS. 12A and 12D, eddy currents due to the combined gradient pulse Gcrush+Gv uniformly exert an influence on all of four refocus pulses (RF pulses $\alpha1°$ y, $\alpha2°$ y, $-\alpha1°$ y and $-\alpha2°$ y). Thus, the four refocus pulses (RF pulses $\alpha1°$ y, $\alpha2°$ y, $-\alpha1°$ y and $-\alpha2°$ y) can be transmitted even without waiting for the achievement of the eddy current to zero, thereby making it possible to shorten the time $\tau$ of the sequence (refer to FIGS. 13A and 13B).

FIGS. 13A and 13B are diagrams showing the manner in which the time $\tau$ of the sequence can be shortened.

FIG. 13A is a diagram showing the longitudinal magnetization adjusting sequence 21 before the time $\tau$ of the sequence is shortened, and FIG. 13B is a diagram showing the longitudinal magnetization adjusting sequence 21 after the time $\tau$ of the sequence has been shortened.

The eddy currents due to the combined gradient pulse Gcrush+Gv uniformly influence all of the four refocus pulses (RF pulses $\alpha1°$ y, $\alpha2°$ y, $-\alpha1°$ y and $-\alpha2°$ y). Thus, they are considered little to result in the occurrence of shading in an image even if time intervals $\Delta m$ respectively defined between the refocus pulses (RF pulses $\alpha1°$ y, $\alpha2°$ y, $-\alpha1°$ y and $-\alpha2°$ y) and the immediately preceding gradient pulses are set short. Therefore, the intervals between the respective RF pulses and the intervals between the respective gradient pulses can be narrowed as needed as shown in FIG. 13B, thereby making it possible to shorten the time $\tau$ of the sequence.

Incidentally, although the third embodiment has explained the four refocus pulses (RF pulses $\alpha1°$ y, $\alpha2°$ y, $-\alpha1°$ y and $-\alpha2°$ y), the number of refocus pulses may be, for example, eight or sixteen and is not limited to the four.

Figure 13:
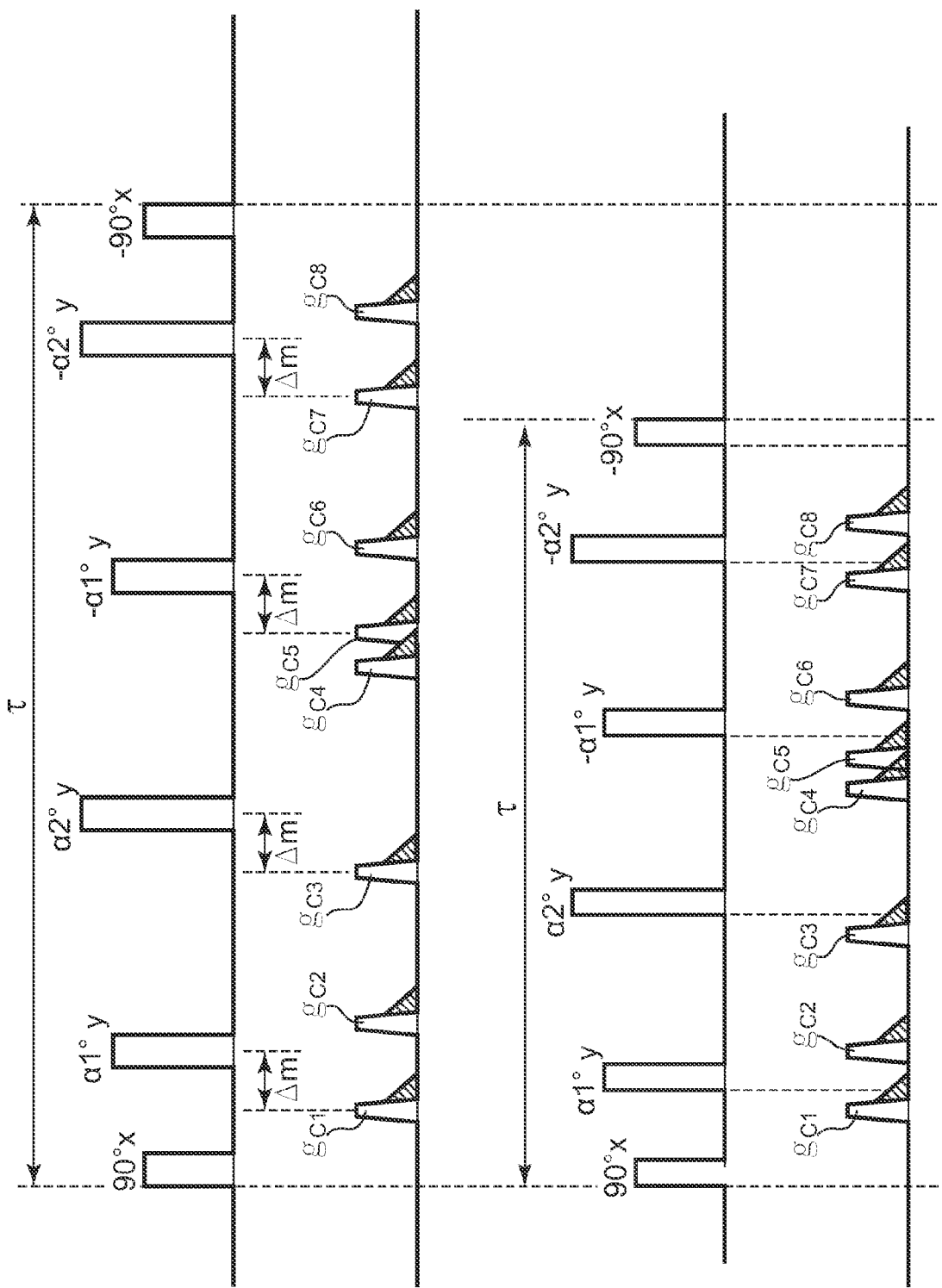
FIGS. 13A and 13B are diagrams showing the manner in which the time τ of the sequence can be shortened.
Figure 14:
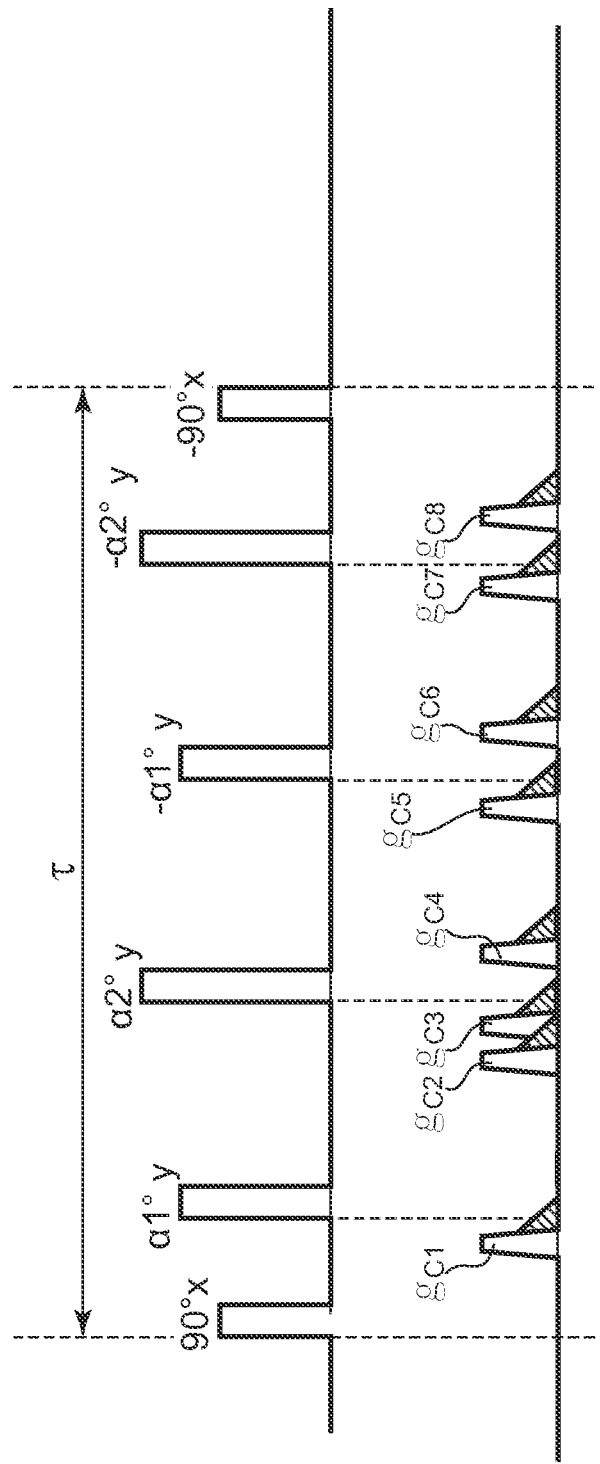
FIG. 14 is a diagram illustrating a sequence when a second gradient pulse $g_{c2}$ located between RF pulses $\alpha1°$ y and $\alpha2°$ y is brought close to a third gradient pulse $g_{c3}$.
Figure 15:
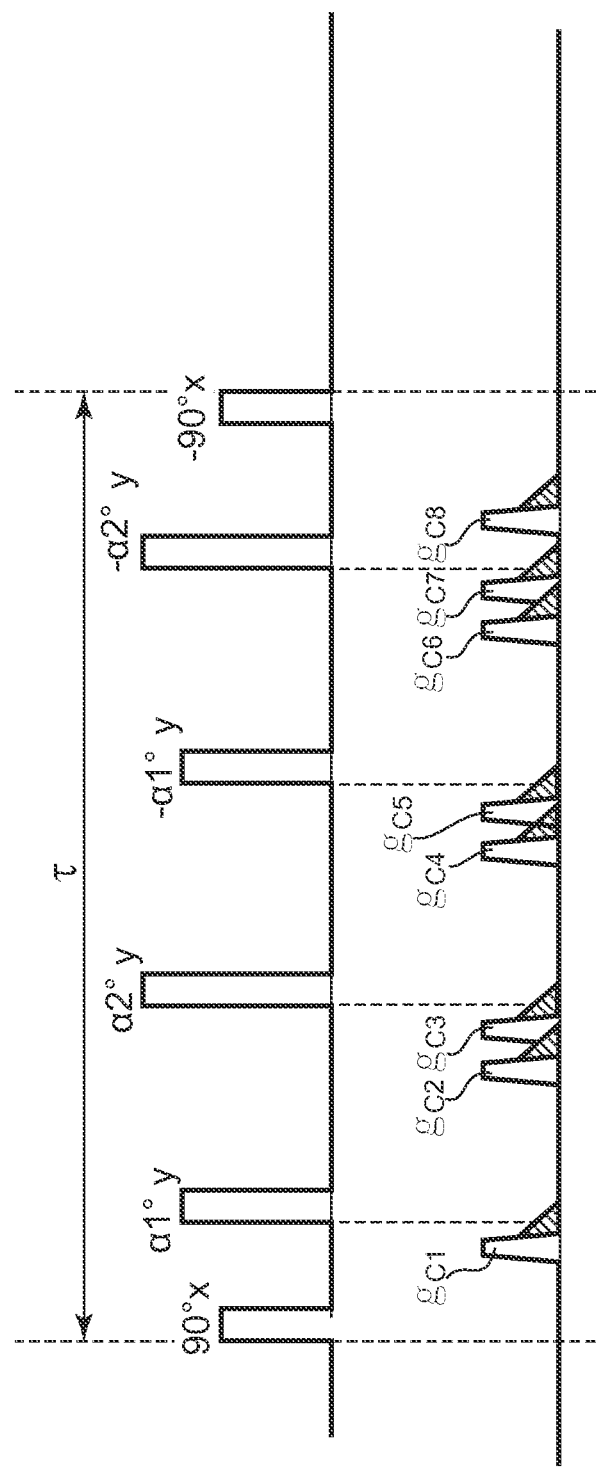
FIG. 15 is a diagram showing a sequence when a plurality of gradient pulses are shifted.

In the third embodiment, the gradient pulse $g_{c4}$ located between the RF pulses $\alpha2°$ y and $-\alpha1°$ y is brought close to the fifth gradient pulse $g_{c5}$ as shown in FIG. 13. Another gradient pulse may however be shifted as in the case of the approach of the second gradient pulse $g_{c2}$ located between the RF pulses $\alpha1°$ y and $\alpha2°$ y to the third gradient pulse $g_{c3}$ as shown in FIG. 14, and the like. As shown in FIG. 15, a plurality of gradient pulses may be shifted.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging (MRI) apparatus for magnetic resonance angiography (MRA) comprising a coil assembly configured to sequentially transmit a plurality of consecutive radio frequency (RF) pulses $\alpha 1°_{\theta 1°}$, $\alpha 2°_{\theta 2°}$, $-\alpha 1°_{\theta 1°}$, and $-\alpha 2°_{\theta 2°}$ one after another, wherein $\alpha 1°$, $\alpha 2°$, $-\alpha 1°$, and $-\alpha 2°$ are the flip angles of the RF pulses, and wherein $\theta 1°$ and $\theta 2°$ are the phases of the RF pulses, wherein the four consecutive RF pulses are transmitted for refocusing transverse magnetization of spins and to cause the transverse magnetization of the spins to change to longitudinal magnetization after the refocusing of the transverse magnetization of the spins, wherein a combination of the flip angles $\alpha 1°$, $\alpha 2°$, $-\alpha 1°$, and $-\alpha 2°$ of the RF pulses $\alpha 1°_{\theta 1°}$, $\alpha 2°_{\theta 2°}$, $-\alpha 1°_{\theta 1°}$, and $-\alpha 2°_{\theta 2°}$ corresponds to any of the following combinations:

($\alpha 1°$, $\alpha 2°$, $-\alpha 1°$, $-\alpha 2°$)=(180°−Δd1°, 180°+Δd2°, −(180°−Δd1°), −(180°+Δd2°));

($\alpha 1°$, $\alpha 2°$, $-\alpha 1°$, $-\alpha 2°$)=(180°+Δd1°, −(180°−Δd2°), −(180°+Δd1°), 180°−Δd2°);

($\alpha 1°$, $\alpha 2°$, $-\alpha 1°$, $-\alpha 2°$)=(−(180°−Δd1°), −(180°+Δd2°), 180°−Δd1°, 180°+Δd2°);

($\alpha 1°$, $\alpha 2°$, $-\alpha 1°$, $-\alpha 2°$)=(−(180°+Δd1°), 180°−Δd2°, 180°+Δd1°, −(180°−Δd2°));

($\alpha 1°$, $\alpha 2°$, $-\alpha 1°$, $-\alpha 2°$)=(180°+Δd1°, 180°−Δd2°, −(180°+Δd1°), −(180°−Δd2°));

($\alpha 1°$, $\alpha 2°$, $-\alpha 1°$, $-\alpha 2°$)=(180°−Δd1°, −(180°+Δd2°), −(180°−Δd1°), 180°+Δd2°);

($\alpha 1°$, $\alpha 2°$, $-\alpha 1°$, $-\alpha 2°$)=(−(180°+Δd1°), −(180°−Δd2°), 180°+Δd1°, 180°−Δd2°); and ($\alpha 1°$, $\alpha 2°$, $-\alpha 1°$, $-\alpha 2°$)=(−(180°−Δd1°), 180°+Δd2°, 180°−Δd1°, −(180°+Δd2°)), where Δd1° is an angle greater than 0° and less than 180° and Δd2° is an angle greater than 0° and less than 180°, and wherein said coil assembly is further configured to:

transmit an RF pulse $\beta°_{\delta°}$, wherein $\beta°$ is the flip angle, and $\delta°$ is the phase of RF pulse, wherein the RF pulse $\beta°_{\delta°}$ is transmitted prior to the RF pulse $\alpha 1°_{\theta 1°}$, and transmit an RF pulse $-\beta°_{\delta°}$, wherein $-\beta°$ is the flip angle, and $\delta°$ is the phase of RF pulse, wherein the RF pulse $-\beta°_{\delta°}$ is transmitted after the RF pulse $-\alpha 2°_{\theta 2°}$.

2. The magnetic resonance imaging apparatus according to claim 1, wherein a time interval between a central time point of the RF pulse $\alpha 1°_{\theta 1°}$ and a central time point of the RF pulse $\alpha 2°_{\theta 2°}$ is twice a time interval between a central time point of the RF pulse $\beta°_{\delta°}$ so and the central time point of the RF pulse $\alpha 1°_{\theta 1°}$, wherein a time interval between the central time point of the RF pulse $\alpha 2°_{\theta 2°}$ and a central time point of the RF pulse $-\alpha 1°_{\theta 1°}$ is twice the time interval between the central time point of the RF pulse $\beta°_{\delta°}$ and the central time point of the RF pulse $\alpha 1°_{\theta 1°}$, wherein a time interval between the central time point of the RF pulse $-\alpha 1°_{\theta 1°}$ and a central time point of the RF pulse $-\alpha 2°_{\theta 2°}$ is twice the time interval between the central time point of the RF pulse $\beta°_{\delta°}$ and the central time point of the RF pulse $\alpha 1°_{\theta 1°}$, and wherein a time interval between the central time point of the RF pulse $-\alpha 2°_{\theta 2°}$ and a central time point of the RF pulse $-\beta°_{\delta°}$ is identical to the time interval between the central time point of the RF pulse $\beta°_{\delta°}$ and the central time point of the RF pulse $\alpha 1°_{\theta 1°}$.

3. The magnetic resonance imaging apparatus according to claim 1, wherein said coil assembly is further configured to apply a velocity encode gradient pulse for 180°-shifting the phase of each spin that flows at a first flow velocity and the phase of each spin that flows at a second flow velocity faster than the first flow velocity, or a crusher gradient pulse for causing transverse magnetization of the spin that flows at the second flow velocity to disappear.

4. The magnetic resonance imaging apparatus according to claim 2, wherein said coil assembly is further configured to apply a velocity encode gradient pulse for 180°-shifting the phase of each spin that flows at a first flow velocity and the phase of each spin that flows at a second flow velocity faster than the first flow velocity, or a crusher gradient pulse for causing transverse magnetization of the spin that flows at the second flow velocity to disappear.

5. The magnetic resonance imaging apparatus according to claim 1, wherein said coil assembly is further configured to apply a velocity encode gradient pulse for 180°-shifting the phase of each spin that flows at a first flow velocity and the phase of each spin that flows at a second flow velocity faster than the first flow velocity, and a crusher gradient pulse for causing transverse magnetization of the spin that flows at the second flow velocity to disappear.

6. The magnetic resonance imaging apparatus according to claim 2, wherein said coil assembly is further configured to apply a velocity encode gradient pulse for 180°-shifting the phase of each spin that flows at a first flow velocity and the phase of each spin that flows at a second flow velocity faster than the first flow velocity, and a crusher gradient pulse for causing transverse magnetization of the spin that flows at the second flow velocity to disappear.

7. The magnetic resonance imaging apparatus according to claim 5, wherein said coil assembly is further configured to:
apply the velocity encode gradient pulse in a predetermined direction of a subject; and
apply the crusher gradient pulse in another direction than the predetermined direction of the subject.

8. The magnetic resonance imaging apparatus according to claim 6, wherein said coil assembly is further configured to:
apply the velocity encode gradient pulse in a predetermined direction of a subject; and
apply the crusher gradient pulse in another direction than the predetermined direction of the subject.

9. The magnetic resonance imaging apparatus according to claim 5, wherein the velocity encode gradient pulse and the crusher gradient pulse are combined together on a single axis.

10. The magnetic resonance imaging apparatus according to claim 6, wherein the velocity encode gradient pulse and the crusher gradient pulse are combined together on a single axis.

11. The magnetic resonance imaging apparatus according to claim 1, wherein the phases $\theta 1°$ and $\theta 2°$ of the RF pulses $\alpha 1°_{\theta 1°}$, $\alpha 2°_{\theta 2°}$, $-\alpha 1°_{\theta 1°}$ and $-\alpha 2°_{\theta 2°}$ are coincident with a y axis.

12. The magnetic resonance imaging apparatus according to claim 1, wherein the phases $\delta°$ of the RF pulses $\beta°_{\delta°}$ and $-\beta°_{\delta°}$ are coincident with an x axis.

13. A magnetic resonance imaging (MRI) apparatus for magnetic resonance angiography (MRA) comprising a coil assembly configured to sequentially transmit a plurality of consecutive radio frequency (RF) pulses $\alpha 1°_{\theta 1°}$, $\alpha 2°_{\theta 2°}$, $\alpha 1°_{\theta 1°}$, and $\alpha 2°_{\theta 2°}$ one after another, wherein $\alpha 1°$ and $\alpha 2°$ are the flip angles of the RF pulses, and wherein $\theta 1°$ and $\theta 2°$ are the phases of the RF pulses, wherein the four RF pulses are transmitted for refocusing transverse magnetization of spins, and to cause the transverse magnetization of the spins to change to longitudinal magnetization after the refocusing of the transverse magnetization of the spins, wherein a combination of the flip angles $\alpha 1°$ and $\alpha 2°$ corresponds to any of the following combinations:

($\alpha 1°$, $\alpha 2°$)=(180°−Δd1°, 180°+Δd2°);

$(\alpha1°, \alpha2°)=(180°+\Delta d1°, -(180°-\Delta d2°))$;
$(\alpha1°, \alpha2°)=(-(180°-\Delta d1°), -(180°+\Delta d2°))$;
$(\alpha1°, \alpha2°)=(-(180°+\Delta d1°), 180°-\Delta d2°)$;
$(\alpha1°, \alpha2°)=(180°+\Delta d1°, 180°-\Delta d2°)$;
$(\alpha1°, \alpha2°)=(180°-\Delta d1°, -(180°+\Delta d2°))$;
$(\alpha1°, \alpha2°), =(-(180°+\Delta d1°), -(180°-\Delta d2°))$; and
$(\alpha1, \alpha2°)=(-(180°-\Delta d1°), 180°+\Delta d2°)$, where
$\Delta d1°$ is an angle greater than 0° and less than 180° and $\Delta d2°$ is an angle greater than 0° and less than 180°, and wherein said coil assembly is further configured to:

transmit an RF pulse $\delta°_{\delta°}$, wherein $\beta°$ is the flip angle, and $\delta°$ is the phase of RF pulse, wherein the RF pulse $\delta°_{\delta°}$ is transmitted prior to the first $\alpha1°_{\theta1°}$ RF pulse, and transmit an RF pulse $-\beta°_{\delta°}$, wherein $-\beta°$ is the flip angle, and $\delta°$ is the phase of RF pulse, wherein the RF pulse $-\beta°_{\delta°}$ is transmitted after the second-$\alpha2°_{\theta2°}$ RF pulse.

14. A method of magnetic resonance imaging for magnetic resonance angiography comprising:

sequentially transmitting, using a coil assembly, a plurality of consecutive radio frequency (RF) pulses $\alpha1°_{\theta1°}$, $\alpha2°_{\theta2°}$, $-\alpha1°_{\theta1°}$, and $-\alpha2°_{\theta2°}$ one after another, wherein $\alpha1°$, $\alpha2°$, $-\alpha1°$, and $-\alpha2°$ are the flip angles of the RF pulses, and wherein $\theta1°$ and $\theta2°$ are the phases of the RF pulses, wherein the four RF pulses are transmitted for refocusing transverse magnetization of spins and to cause the transverse magnetization of the spins to change to longitudinal magnetization after the refocusing of the transverse magnetization of the spins;

transmitting an RF pulse $\beta°_{\delta°}$, wherein $\beta°$ is the flip angle, and $\delta°$ is the phase of RF pulse, wherein the RF pulse $\beta°_{\delta°}$ is transmitted prior to the RF pulse $\alpha1°_{\theta1°}$; and transmitting an $-\beta°_{\delta°}$, wherein $-\beta°$ is the flip angle, and $\delta°$ is the phase of RF pulse, wherein the RF pulse $-\beta°_{\delta°}$ is transmitted after the RF pulse $-\alpha2°_{\theta2°}$, wherein a combination of the flip angles $\alpha1°$, $\alpha2°$, $-\alpha1°$, and $-\alpha2°$ of the RF pulses $\alpha1°_{\theta1°}$, $\alpha2°_{\theta2°}$, $-\alpha1°_{\theta1°}$, and $-\alpha2°_{\theta2°}$ corresponds to any of the following combinations:

$(\alpha1°, \alpha2°, -\alpha1°, -\alpha2°)=(180°-\Delta d1°, 180°+\Delta d2°, -(180°-\Delta d1°), -(180°+\Delta d2°))$;

$(\alpha1°, \alpha2°, -\alpha1°, -\alpha2°)=(180°+\Delta d1°, -(180°-\Delta d2°), -(180°+\Delta d1°), 180°-\Delta d2°)$;

$(\alpha1°, \alpha2°, -\alpha1°, -\alpha2°)=(-(180°-\Delta d1°), -(180°+\Delta d2°), 180°-\Delta d1°, 180°+\Delta d2°)$;

$(\alpha1°, \alpha2°, -\alpha1°, -\alpha2°)=(-(180°+\Delta d1°), 180°-\Delta d2°, 180°+\Delta d1°, -(180°-\Delta d2°))$;

$(\alpha1°, \alpha2°, -\alpha1°, -\alpha2°)=(180°+\Delta d1°, 180°-\Delta d2°, -(180°+\Delta d1°), -(180°-\Delta d2°))$;

$(\alpha1°, \alpha2°, -\alpha1°, -\alpha2°)=(180°-\Delta d1°, -(180°+\Delta d2°), -(180°-\Delta d1°), 180°+\Delta d2°)$;

$(\alpha1°, \alpha2°, -\alpha1°, -\alpha2°)=(-(180°+\Delta d1°), -(180°-\Delta d2°), 180°+\Delta d1°, 180°-\Delta d2°)$; and $(\alpha1°, \alpha2°, -\alpha1°, -\alpha2°)=(-(180°-\Delta d1°), 180°+\Delta d2°, 180°-\Delta d1°, -(180°+\Delta d2°))$, where $\Delta d1°$ is an angle greater than 0° and less than 180° and $\Delta d2°$ is an angle greater than 0° and less than 180°.

* * * * *